(12) United States Patent
Colles et al.

(10) Patent No.: US 11,777,481 B2
(45) Date of Patent: *Oct. 3, 2023

(54) NOISE-TOLERANT DELAY CIRCUIT

(71) Applicant: Silanna Asia Pte Ltd, Singapore (SG)

(72) Inventors: Joseph H. Colles, Bonsall, CA (US); Steven E. Rosenbaum, San Diego, CA (US); Stuart B. Molin, Carlsbad, CA (US)

(73) Assignee: Silanna Asia Pte Ltd, Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 17/823,019

(22) Filed: Aug. 29, 2022

(65) Prior Publication Data

US 2022/0416775 A1 Dec. 29, 2022

Related U.S. Application Data

(63) Continuation of application No. 17/454,207, filed on Nov. 9, 2021, now Pat. No. 11,451,220.

(60) Provisional application No. 63/198,931, filed on Nov. 23, 2020.

(51) Int. Cl.
*H03K 5/134* (2014.01)
*H03K 5/00* (2006.01)
*H03K 5/13* (2014.01)

(52) U.S. Cl.
CPC .............. *H03K 5/134* (2014.07); *H03K 5/13* (2013.01); *H03K 2005/00202* (2013.01)

(58) Field of Classification Search
None
See application file for complete search history.

(56) References Cited

U.S. PATENT DOCUMENTS

| 4,853,654 | A  | 8/1989 | Sakurai |
| 6,747,500 | B2 | 6/2004 | Mawet |
| 7,068,195 | B1 | 6/2006 | Menkus |
| 9,100,004 | B2 | 8/2015 | Daigle |

(Continued)

FOREIGN PATENT DOCUMENTS

CN 111614347 A 9/2020

OTHER PUBLICATIONS

International Search Report and Written Opinion dated Feb. 18, 2022 for PCT Patent Application No. PCT/IB2021/060377.

(Continued)

*Primary Examiner* — Cassandra F Cox
(74) *Attorney, Agent, or Firm* — MLO, a professional corp.

(57) ABSTRACT

In a delay circuit, first and second sets of transistors are connected in series between a supply voltage and a ground. The first and second sets of transistors both include a current source transistor, a cascode transistor, and a control transistor. The first set of transistors generates a current that charges a capacitor to generate a ramp signal with a positive slope. A first bias transistor may cause the ramp signal to be biased to ground upon activating the first set of transistors. The second set of transistors generates a current that discharges the capacitor to generate the ramp signal with a negative slope. A second bias transistor may cause the ramp signal to be biased to the supply voltage upon activating the second set of transistors. The delay circuit transitions the state of the output signal based on a voltage level of the ramp signal.

20 Claims, 8 Drawing Sheets

(56) References Cited

U.S. PATENT DOCUMENTS

| | | |
|---|---|---|
| 10,541,692 B1 | 1/2020 | Zamprogno et al. |
| 10,812,056 B1 | 10/2020 | Wu et al. |
| 11,451,220 B2 * | 9/2022 | Colles .................. H03K 5/134 |
| 2001/0040473 A1 | 11/2001 | Yoshikawa |
| 2002/0089365 A1 | 7/2002 | Gupta |
| 2002/0093370 A1 | 7/2002 | Park et al. |
| 2006/0197572 A1 | 9/2006 | Suzuki et al. |
| 2008/0180154 A1 | 7/2008 | Brannen |
| 2010/0134083 A1 | 6/2010 | Trescases |
| 2011/0234284 A1 | 9/2011 | Kuwagata |
| 2013/0214869 A1 | 8/2013 | Matsuzaki et al. |
| 2016/0065220 A1 | 3/2016 | Rana et al. |
| 2020/0162026 A1 | 5/2020 | Chawla |

OTHER PUBLICATIONS

Notice of Allowance and Fees dated May 26, 2022 for U.S. Appl. No. 17/454,207.

\* cited by examiner

NOISE-TOLERANT DELAY CIRCUIT

RELATED APPLICATIONS

This application is a continuation of U.S. patent application Ser. No. 17/454,207, filed on Nov. 9, 2021, which claims priority to U.S. Provisional Patent Application No. 63/198,931, filed on Nov. 23, 2020, and entitled, "Noise-Tolerant Delay Circuit", all of which is hereby incorporated by reference in its entirety and for all purposes.

BACKGROUND

In many types of electronic circuit applications that require driving relatively high currents with relatively fast edges, noise in the ground voltage or the supply voltage created due to parasitic inductances within the electronic circuit can interfere with the proper operation of digital circuits. Such electronic circuits commonly use delay circuits to generate signals for producing the fast edges with relatively short time periods therebetween. Conventional delay circuits typically use current controlled ramp signals with comparators and reference voltages or oscillators to create pulses using latches, counters, and decoders. Many such components are generally referred to as "memory elements," which are edge triggered devices that latch a signal state. However, noise in the ground voltage or supply voltage can cause fluctuations in a signal state that can potentially result in latching a false or incorrect state. This situation can then potentially result in random changes in the functionality of the digital output of the overall circuit that uses the delay circuit. Such random changes in functionality can create a failure of the overall circuit from which it cannot recover.

In some types of applications, such as operation of an autonomous vehicle for example, a random failure of the vehicle's control circuit could be catastrophic, since it could create a dangerous situation wherein control of the vehicle is lost when travelling at highway speeds on a congested roadway. Robustness to noise is, thus, a very important circuit design issue in these and other applications. Additionally, circuit layout on a printed circuit board (PCB) is critical in such applications and can often require several costly and time-consuming layout design revisions to deal with parasitic inductances between components on the PCB.

SUMMARY

A delay circuit that does not include any memory elements and that is highly noise-tolerant generally includes a reference current generator and at least one delay stage. The reference current generator generates first and second bias control signals. The first and the second bias control signals are based on a reference current that is generated in the reference current generator and that is dependent on a supply voltage and a resistance of a resistor. The delay stage has first and second inverting delay elements electrically connected in series. The first and second inverting delay elements each include an input set of transistors, a capacitor, first and second sets of transistors, first and second bias transistors, and an output set of transistors. The input set of transistors inverts an input signal to produce an inverted input signal. The first set of transistors forms a first current source when activated. The first current source generates a first current about equal to the reference current and is electrically connected to the capacitor to generate a ramp signal with a positive slope by charging the capacitor with the first current in accordance with the first bias control signals during a first time period. The first set of transistors are activated by a first state of the inverted input signal and deactivated by a second state of the inverted input signal. The second set of transistors forms a second current source when activated. The second current source generates a second current about equal to the reference current and is electrically connected to the capacitor to generate the ramp signal with a negative slope by discharging the capacitor with the second current in accordance with the second bias control signals during a second time period. The second set of transistors are activated by the second state of the inverted input signal and deactivated by the first state of the inverted input signal. The second current is about equal in magnitude to the first current. The first bias transistor causes the ramp signal to be biased to a ground voltage when the first set of transistors is activated at a start of the first time period, which causes the ramp signal to ramp up during the first time period from the ground voltage towards the supply voltage, and which causes the ramp signal to be substantially linear during an initial portion of the first time period. The second bias transistor causes the ramp signal to be biased to the supply voltage when the second set of transistors is activated at a start of the second time period, which causes the ramp signal to ramp down during the second time period from the supply voltage towards the ground voltage, and which causes the ramp signal to be substantially linear during an initial portion of the second time period. The output set of transistors produces an output signal and transitions a state of the output signal when the ramp signal ramps up to a threshold voltage at an end of the initial portion of the first time period and when the ramp signal ramps down to the threshold voltage at an end of the initial portion of the second time period, the output signal having an inverted state of the input signal. The output signal of the first inverting delay element is provided as the input signal for the second inverting delay element. The output signal of the second inverting delay element has a same state as the input signal of the first inverting delay element. The output signal of the second inverting delay element is delayed from the input signal of the first inverting delay element by a stage delay time period. The stage delay time period is determined substantially by the resistance of the resistor and the capacitance of the capacitor. The stage delay time period is substantially independent of the supply voltage and a temperature of the delay circuit.

In some embodiments, multiple delay stages are electrically connected in series. The output signal of the second inverting delay element of each delay stage that precedes a subsequent delay stage is provided as the input signal of the first inverting delay element of the subsequent delay stage. The input signal of the first inverting delay element of an initial delay stage is an overall input signal of the delay circuit. The output signal of the second inverting delay element of a final delay stage is an overall output signal of the delay circuit. The overall output signal of the delay circuit has a same state as the overall input signal of the delay circuit. The overall output signal of the delay circuit is delayed from the overall input signal of the delay circuit by an overall delay time period. The overall delay time period is determined substantially by the resistance of the resistor, the capacitance of the capacitor of each of the first and second inverting delay elements, and a total number of the first and second inverting delay elements of all of the multiple delay stages. The overall delay time period is substantially independent of the supply voltage and a temperature of the delay circuit.

In some embodiments, a delay circuit includes a delay element that includes an input, an output, a first set of transistors, a second set of transistors, and a capacitor. The input receives an input signal. The output produces an output signal that is delayed from the input signal and has a state that is an inverted state of the input signal. The first set of transistors includes a first current source transistor, a first cascode transistor, and a first control transistor. The second set of transistors includes a second control transistor, a second cascode transistor, and a second current source transistor. The first set of transistors and the second set of transistors are electrically connected in series between a supply voltage and a ground voltage. The capacitor has a node that is electrically connected between the first control transistor and the second control transistor. The first set of transistors form a first current source that generates a first current that charges the capacitor to generate a ramp signal with a positive slope when the first control transistor is activated in response to a first state of the input signal. The second set of transistors form a second current source that generates a second current that discharges the capacitor to generate the ramp signal with a negative slope when the second control transistor is activated in response to a second state of the input signal. The delay circuit transitions the state of the output signal based on a voltage level of the ramp signal.

In some embodiments, a delay circuit includes a delay element that includes an input, an output, a capacitor, a first set of transistors, a second set of transistors, a first bias transistor, and a second bias transistor. The input receives an input signal. The output produces an output signal that is delayed from the input signal and has a state that is an inverted state of the input signal. The capacitor has a node that is electrically connected between the first set of transistors and the second set of transistors. The first set of transistors forms a first current source that generates a first current that charges the capacitor to generate a ramp signal with a positive slope when the first set of transistors is activated in response to a first state of the input signal. The second set of transistors forms a second current source that generates a second current that discharges the capacitor to generate the ramp signal with a negative slope when the second set of transistors is activated in response to a second state of the input signal. The first set of transistors and the second set of transistors are electrically connected in series between a supply voltage and a ground voltage. The first bias transistor causes the ramp signal to be biased to the ground voltage when the first set of transistors is activated at a start of a first time period, which causes the ramp signal to ramp up during the first time period from the ground voltage towards the supply voltage, and which causes the ramp signal to be substantially linear during an initial portion of the first time period. The second bias transistor causes the ramp signal to be biased to the supply voltage when the second set of transistors is activated at a start of a second time period, which causes the ramp signal to ramp down during the second time period from the supply voltage towards the ground voltage, and which causes the ramp signal to be substantially linear during an initial portion of the second time period. The delay circuit transitions the state of the output signal based on a voltage level of the ramp signal.

DETAILED DESCRIPTION

Figure 1:
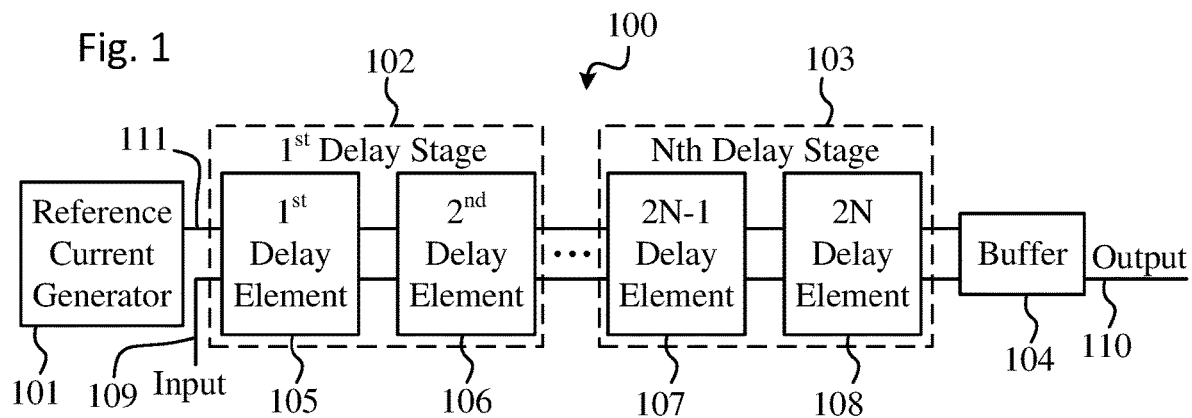
FIG. 1 is a simplified schematic diagram of a delay circuit, in accordance with some embodiments.

FIG. 1 shows an example delay circuit 100 that does not include any memory elements and that is highly noise-tolerant, in accordance with some embodiments. Additionally, because of the noise-tolerance of the delay circuit 100, overall circuits that use the delay circuit 100 can potentially be designed with fewer layout design revisions to deal with parasitic inductances between components on the PCB, thereby reducing the cost and time to finalize the design of the overall circuit.

In some embodiments, the delay circuit 100 generally includes a reference current generator 101, N delay stages (e.g., 102 and 103), and an output buffer 104. Each delay stage 102 and 103 generally includes two inverting delay elements, e.g., first and second inverting delay elements 105 and 106 in the first delay stage 102 and 2N-1 and 2N inverting delay elements 107 and 108 in the Nth delay stage 103. In some embodiments, therefore, the delay circuit 100 includes N pairs of delay elements or 2N delay elements. Other components may also be included in the delay circuit 100 but are not shown for simplicity of illustration and explanation.

The delay circuit 100 generally receives an overall input signal at 109 at the initial or first delay stage 102 (or the first delay element 105 thereof) and propagates the overall input signal through each delay stage 102 and 103 (i.e., through each delay element 105-108) to produce an overall output signal at 110 from the final or Nth delay stage 103 (or the second delay element 108 thereof). The overall output signal at 110 of the delay circuit 100 generally has a same state as the overall input signal at 109 and is delayed from the overall input signal at 109 by an overall delay time period. The overall output signal at 110 is, thus, generally a delayed version of the overall input signal at 109.

Each delay element 105-108 delays the overall input signal by a predetermined "element delay time period." Thus, each delay stage 102 and 103 delays the overall input signal by a predetermined "stage delay time period" that is the sum of the two element delay time periods of the pair of delay elements 105/106 or 107/108 therein. In some embodiments, if the transistor components (described below) of the delay elements 105-108 are formed to be generally similar P-type MOSFETs and N-type MOSFETs, then the element delay time period of each delay element 105-108 is about the same (given a same capacitor used in the delay elements 105-108 for generating the delay), so the stage delay time period of each delay stage 102 and 103 is also about the same. On the other hand, in some embodiments, if the transistor components of the delay elements 105-108 are formed such that the P-type MOSFETs and N-type MOSFETs are somewhat different from each other, then the element delay time period of each delay element 105-108 is somewhat different (as described below). Nevertheless, the capacitor and transistor components of the delay elements 105-108 are formed such that the element delay time period of the first delay element (e.g., 105 and 107) of each delay stage 102 and 103 is about the same, and the element delay time period of the second delay element (e.g., 106 and 108) of each delay stage 102 and 103 is about the same, even if the element delay time period of each first delay element (e.g., 105 and 107) is different from the element delay time period of each second delay element (e.g., 106 and 108). Thus, the combination of two delay elements in each delay stage results in each delay stage 102 and 103 delaying the overall input signal as it propagates therethrough by about the same amount regardless of how the transistor components are formed, thereby resulting in the stage delay time period being, to a first order, independent of manufacturing process variations for the transistor components.

The reference current generator (a.k.a. a bias signal generator) 101 generally produces bias control signals at 111. The bias control signals are based on a reference current that is generated in the reference current generator 101. The reference current is dependent on a voltage level of a supply voltage Vdd and a resistance of a reference resistor. The reference current is proportional to supply voltage Vdd, e.g., Vdd/2. The transistor components in the reference current generator 101 are formed about the same as corresponding transistor components in the delay elements 105-108, so that application of the bias control signals to the transistor components in the delay elements 105-108 will cause the transistor components in the delay elements 105-108 to generate about the same current as that of the reference current. This current within the transistor components of the delay elements 105-108 is used to cause the signal delay for the element delay time period in a manner (as described below) that, to a first order, is independent of the supply voltage and temperature variations of the components within the delay circuit 100. The output buffer 104 then produces the overall output signal at 110 from the output of the final delay stage 103 (i.e., the output of the final delay element 108).

Figure 2:
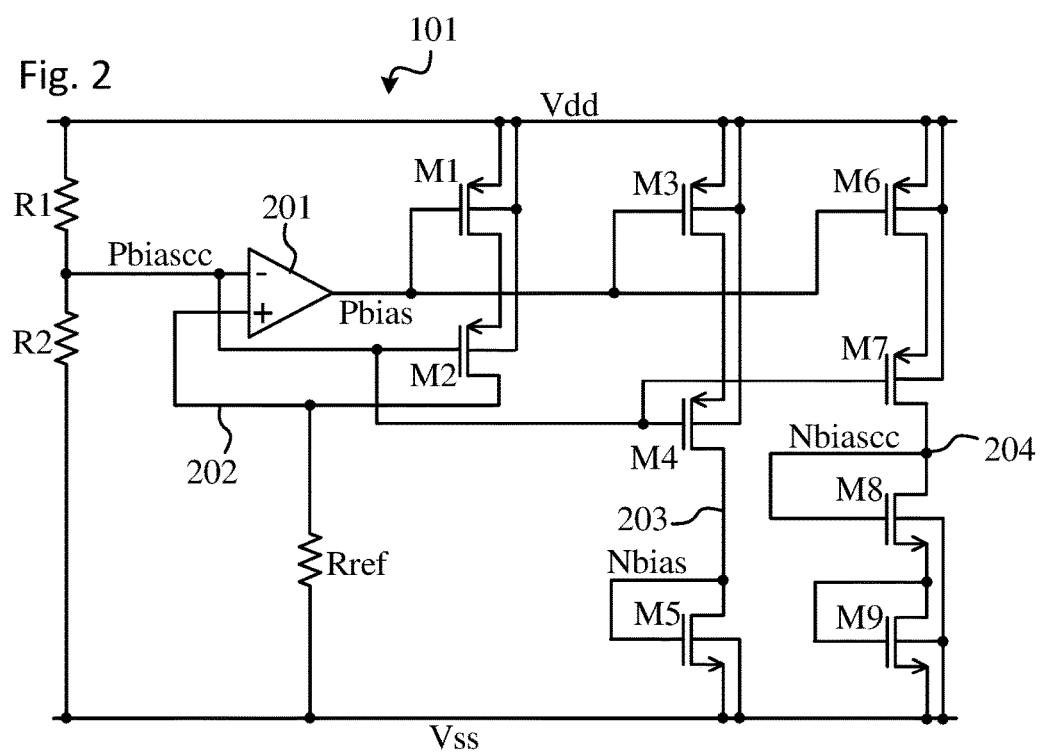
FIG. 2 is a simplified schematic diagram of a reference current generator for use in the delay circuit shown in FIG. 1, in accordance with some embodiments.

FIG. 2 shows a simplified schematic of an example of the reference current generator 101, in accordance with some embodiments. The reference current generator 101 generally includes voltage divider resistors R1 and R2, a reference resistor Rref, an operational amplifier (op amp) 201, PFETs M1-4, M6 and M7, and NFETs M5, M8 and M9, among other possible components (e.g., stabilizing capacitors) not shown for simplicity. Power is provided by the supply voltage Vdd and a ground or reference voltage Vss.

The voltage divider resistors R1 and R2 are electrically connected in series between the supply voltage Vdd and the reference voltage Vss. A node between the voltage divider resistors R1 and R2 is electrically connected to a negative input of the op amp 201 and to gate nodes of PFETs M2, M4 and M7, so that the resistors R1 and R2 form a voltage divider at this node. A positive input of the op amp 201 is electrically connected (at node 202) to a first node of the reference resistor Rref and a drain node of the PFET M2. A second node of the reference resistor Rref is electrically connected to the reference voltage Vss. An output of the op amp 201 is electrically connected to gate nodes of the PFETs M1, M3 and M6. Source nodes of the PFETs M1, M3 and M6 are electrically connected to the supply voltage Vdd. A drain node of the PFET M1 is electrically connected to a source node of the PFET M2, so that the PFETs M1 and M2 and the reference resistor Rref are electrically connected in series between the supply voltage Vdd and the reference voltage Vss. A drain node of the PFET M3 is electrically connected to a source node of the PFET M4, a drain node of the PFET M4 is electrically connected to a drain node and a gate node of the NFET M5, and a source node of the NFET M5 is electrically connected to the reference voltage Vss, so that the PFETs M3 and M4 and the NFET M5 are electrically connected in series between the supply voltage Vdd and the reference voltage Vss. A drain node of the PFET M6 is electrically connected to a source node of the PFET M7, a drain node of the PFET M7 is electrically connected to a drain node and a gate node of the NFET M8, a source node of the NFET M8 is electrically connected to a drain node and a gate node of the NFET M9, and a source node of the NFET M9 is electrically connected to the reference voltage Vss, so that the PFETs M6 and M7 and the NFETs M8 and M9 are electrically connected in series between the supply voltage Vdd and the reference voltage Vss.

With the above described configuration of the components of the reference current generator 101, and with voltage divider resistors R1 and R2 having about equal resistance, the divided voltage between them (designated as cascode PFET bias voltage Pbiascc) is about one half of the supply voltage Vdd (i.e., Vdd/2). The cascode PFET bias voltage Pbiascc is provided to the negative input of the op amp 201 and to the gate nodes of PFETs M2, M4 and M7. A voltage at node 202 created by a current through the reference resistor Rref is provided to the positive input of the op amp 201. An output of the op amp 201 is designated as a PFET bias voltage Pbias. The PFET bias voltage Pbias is provided to the gate nodes of the PFETs M1, M3 and M6. When the PFET M1 is activated (turned on) by the PFET bias voltage Pbias and the PFET M2 is activated by the cascode PFET bias voltage Pbiascc, a current through the PFETs M1 and M2 is provided to the reference resistor Rref to generate the voltage at node 202. The current through the reference resistor Rref is the reference current mentioned above. The operation of the op amp 201 in the above described configuration provides a closed loop control that ensures that the PFET bias voltage Pbias maintains the PFET M1 appropriately turned on (while the cascode PFET bias voltage Pbiascc maintains the PFET M2 appropriately turned on) to cause the appropriate current level for the reference current to flow therethrough to generate the voltage at node 202 to match the voltage level of the cascode PFET bias voltage Pbiascc.

The op amp 201 maintains the PFET bias voltage Pbias at a relatively constant voltage level so long as the supply voltage Vdd remains constant. Any fluctuation in the supply voltage Vdd, however, will result in matching fluctuations in the cascode PFET bias voltage Pbiascc and in the PFET bias voltage Pbias, so that the reference current generated by the reference resistor Rref tracks the supply voltage Vdd. Additionally, the current level of the reference current is set by or based on the resistance of the reference resistor Rref, since decreasing the resistance will increase the current and increasing the resistance will decrease the current. Furthermore, the PFET M2 serves as a cascode that holds the drain-to-source voltage across the PFET M1 more steady than it would otherwise be, so that the PFET M1 can properly serve as a current source for the reference current.

With the above described configuration of the PFETs M3 and M4 and the NFET M5, the application of the PFET bias voltage Pbias to the PFET M3 (to serve as a current source that matches the current source of the PFET M1) and the application of the cascode PFET bias voltage Pbiascc to the PFET M4 (to match the cascode of the PFET M2) ensures that the PFETs M3 and M4 allow a current to pass therethrough that is about the same as the reference current, thereby mirroring the reference current. The reference current thus generated is passed through the NFET M5. The reference current through the NFET M5 ensures that a voltage is generated at a node 203 (an NFET bias voltage Nbias that is comparable to, though not necessarily equal to, the PFET bias voltage Pbias) at an appropriate voltage level for activating the gate node of the NFET M5 to allow the reference current to pass therethrough. The gate voltage on the NFET M5, thus, will create the same reference current through another NFET of the same size, i.e., an NFET current source.

With the above described configuration of the PFETs M6 and M7 and the NFETs M8 and M9, the application of the PFET bias voltage Pbias to the PFET M6 and the application of the cascode PFET bias voltage Pbiascc to the PFET M7 ensures that the PFETs M7 and M8 allow a current to pass therethrough that is about the same as the reference current, thereby mirroring the reference current, which is passed through the NFETs M8 and M9. The reference current through the NFETs M8 and M9 ensures that a voltage is generated at a node 204 (a cascode NFET bias voltage Nbiascc that is comparable to the cascode PFET bias voltage Pbiascc) at an appropriate voltage level for activating the gate node of the NFET M8 to allow the reference current to pass therethrough followed by activating the gate node of the NFET M9. Therefore, the cascode NFET bias voltage Nbiascc can be applied to a cascode NFET for the NFET current source to ensure that the NFET current source is steady.

The PFET bias voltage Pbias and the cascode PFET bias voltage Pbiascc are first bias control signals that are based on the reference current and that are provided to the delay elements 105-108. Additionally, the NFET bias voltage Nbias and the cascode NFET bias voltage Nbiascc are second bias control signals that are based on the reference current and that are provided to the delay elements 105-108. The first and second bias control signals form the bias control signals at 111 mentioned above, which are used within the delay elements 105-108 as described below.

The reference current generator 101, thus, sets up the primary current source bias voltages Pbias and Nbias and the cascode bias voltages Pbiascc and Nbiascc that are used by the delay elements 105-108, as described below. Additionally, the reference current generator 101 causes these bias control signals to track the supply voltage Vdd, so that if the supply voltage Vdd changes, then the bias control signals will change correspondingly, thereby causing the reference current to also change accordingly. The result of the bias control signals and the reference current tracking the supply voltage Vdd ensures that the operation of the delay elements 105-108 cause a signal delay that is independent of the supply voltage Vdd to a first order, as described below.

Figure 3:
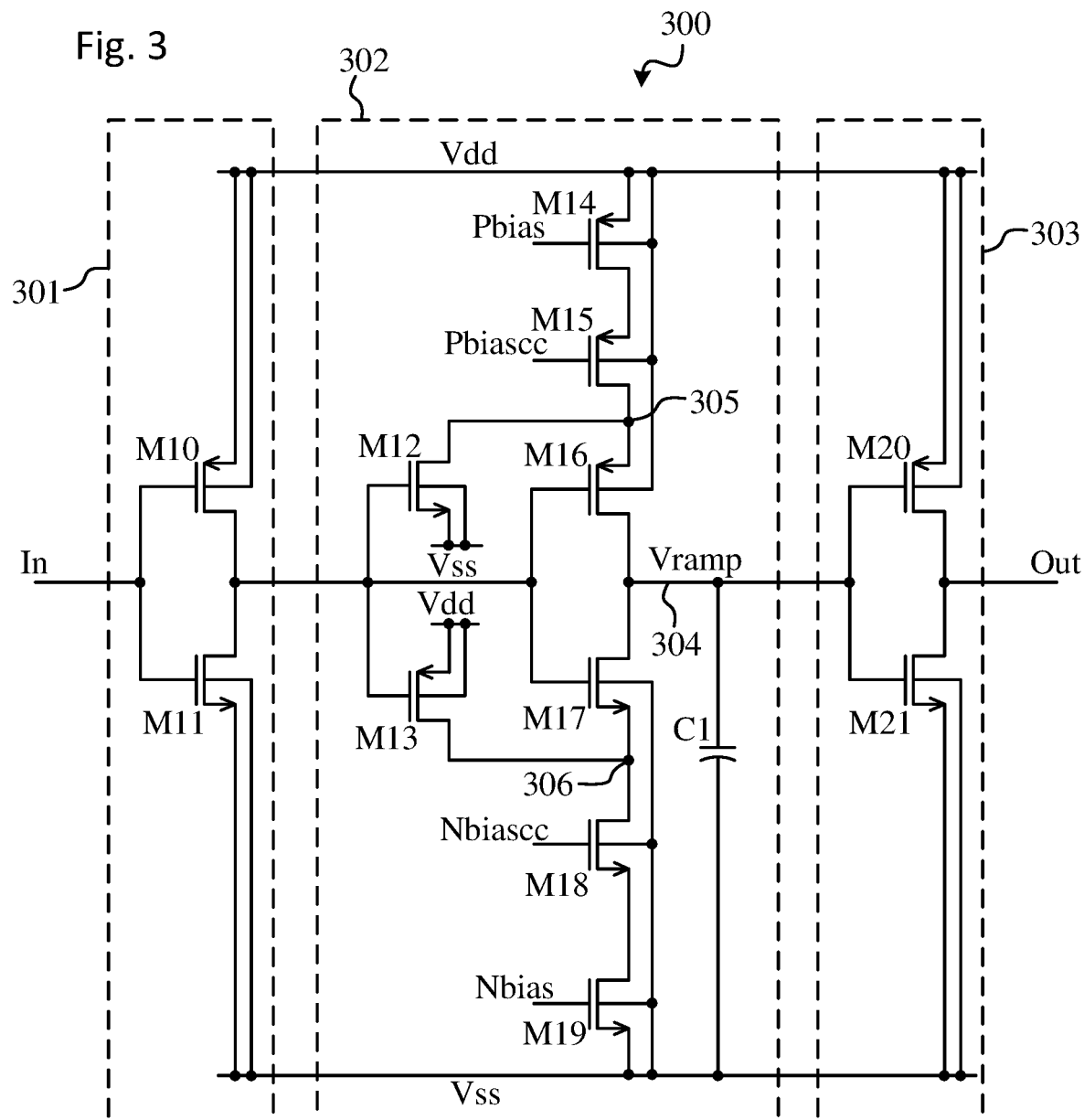
FIG. 3 is a simplified schematic diagram of a delay element for use in the delay circuit shown in FIG. 1, in accordance with some embodiments.

FIG. 3 shows a simplified schematic of an example inverting delay element 300 that can be used for each of the delay elements 105-108, in accordance with some embodiments. The delay element 300 generally includes a first inverter buffer 301, a main delay inverter 302 and a second inverter buffer 303, among other possible components not shown for simplicity. The first inverter buffer 301 generally includes PFET M10 and NFET M11; the main delay inverter 302 generally includes PFETs M13-16, NFETs M12 and M17-19 and a delay element capacitor C1 (e.g., an on-chip metal-insulator-metal (MIM) capacitor); and the second inverter buffer 303 generally includes PFET M20 and NFET M21.

The first inverter buffer 301 receives a delay element input signal (In); and the second inverter buffer 303 produces a delay element output signal (Out), which is generally an inverted and delayed version of the delay element input signal (In). When the delay element 300 is the first delay element 105 of the initial or first delay stage 102 (i.e., the initial or first delay element of the delay circuit 100), the delay element input signal (In) is the overall input signal at 109. When the delay element 300 is any of the subsequent delay elements 106-108, the delay element input signal (In) is the delay element output signal (Out) of the preceding delay element 105-107. When the delay element 300 is the second delay element 108 of the final or Nth delay stage 103 (i.e., the final or 2Nth delay element of the delay circuit 100), the delay element output signal (Out) is provided to the output buffer 104. Thus, since there are 2N (i.e., an even number of) the delay elements 105-108, the delay element output signal (Out) of the last delay element 108 has a same state as the delay element input signal (In) of the first delay element 105.

The PFET M10 and NFET M11 of the first inverter buffer 301 represent an input set of transistors that inverts the delay element input signal (In) to produce an inverted input signal that is provided to the main delay inverter 302. A source node of the PFET M10 is electrically connected to the supply voltage Vdd, a drain node of the PFET M10 is electrically connected to a drain node of the NFET M11, and a source node of the NFET M11 is electrically connected to the reference voltage Vss. Gate nodes of the PFET M10 and the NFET M11 are electrically connected to receive the delay element input signal (In). In this configuration, the first inverter buffer 301 produces a logic high for the inverted input signal when the delay element input signal (In) is a logic low and produces a logic low for the inverted input signal when the delay element input signal (In) is a logic high.

The main delay inverter 302 generally causes the bulk of the delay in the propagation of the delay element input signal (In) to the delay element output signal (Out) by producing a voltage ramp signal Vramp (with a finite slope that is inverted from that of the triggering edge of the inverted input signal) by charging and discharging the capacitor C1. The main delay inverter 302 is generally a current controlled inverter driving the capacitor C1.

A gate node of the PFET M14 is electrically connected to receive the PFET bias voltage Pbias, a gate node of the PFET M15 is electrically connected to receive the cascode PFET bias voltage Pbiascc, a gate node of the NFET M19 is electrically connected to receive the NFET bias voltage Nbias, a gate node of the NFET M18 is electrically connected to receive the cascode NFET bias voltage Nbiascc, and gate nodes of the PFETs M13/M16 and of the NFETs M12/M17 are electrically connected to receive the inverted input signal provided by the first inverter buffer 301. Thus, the PFETs M13/M16 and the NFETs M12/M17 are activated in accordance with the inverted input signal provided by the first inverter buffer 301, and the PFETs M14/M15 and the NFETs M18/M19 are activated in accordance with corresponding bias control signals provided by the reference current generator 101.

A source node of the PFET M14 is electrically connected to the supply voltage Vdd, a drain node of the PFET M14 is electrically connected to a source node of the PFET M15, a drain node of the PFET M15 is electrically connected to a source node of the PFET M16, and a drain node of the PFET M16 is electrically connected to a first node of the capacitor C1 at 304, so that the PFETs M14-16 are electrically connected in series between the supply voltage Vdd and the first node of the capacitor C1 at 304. A source node of the NFET M19 is electrically connected to the reference voltage Vss, a drain node of the NFET M19 is electrically connected to a source node of the NFET M18, a drain node of the NFET M18 is electrically connected to a source node of the NFET M17, and a drain node of the NFET M17 is electrically connected to the first node of the capacitor C1 at 304, so that the NFETs M17-19 are electrically connected in series between the reference voltage Vss and the first node of the capacitor C1 at 304. Thus, the first node of the capacitor C1 is electrically connected between the PFET M16 and the NFET M17. A second node of the capacitor C1 is electrically connected to the reference voltage Vss. Additionally, the PFETs M14-16 and the NFETs M17-19 are electrically connected in series between the supply voltage Vdd and the reference voltage Vss.

Additionally, a drain node of the NFET M12 is electrically connected at a node 305 to the drain node of the PFET M15 and the source node of the PFET M16, and a source node of the NFET M12 is electrically connected to the reference voltage Vss. Also, a drain node of the PFET M13 is electrically connected at a node 306 to the drain node of the NFET M18 and the source node of the NFET M17, and a source node of the PFET M13 is electrically connected to the supply voltage Vdd.

With the above described configuration of the main delay inverter 302, when the inverted input signal provided by the first inverter buffer 301 goes low (a first state of the inverted input signal), the PFET M16 (i.e., a first or high-side control transistor) turns on (and the NFET M17 turns off), so that the PFETs M14-16 (i.e., first or high-side transistors) are activated (and the NFETs M17-19 are deactivated). The PFET M16, thus, is activated by the first state of the inverted input signal (or in response to a first state of the delay element input signal (In)) and is deactivated by a second state of the inverted input signal (or in response to a second state of the delay element input signal (In)). Activation of the PFET M16 activates the PFETs M14-16 (a first set of transistors) to electrically connect them to the first node of the capacitor C1 at 304 to cause the voltage ramp signal Vramp to ramp up (i.e., with a positive slope). The application of the PFET bias voltage Pbias to the PFET M14 causes the PFET M14 to allow a current to flow therethrough (a first current) that is about the same as the reference current mentioned above, i.e., the reference current is mirrored through the PFET M14, so the PFET M14 (i.e., a first or high-side current source transistor) acts as a current source for the reference current (i.e., the PFETs M14-16 form a first current source when activated). Additionally, the application of the cascode PFET bias voltage Pbiascc to the PFET M15 enables the PFET M15 (i.e., a first or high-side cascode transistor) to serve as a cascode that isolates the capacitor C1 from the PFET M14, thereby isolating the voltage (or voltage change) on the first node of the capacitor C1 at 304 from changing the drain-source voltage Vds on the PFET M14, so that the current source of the PFET M14 does not change the level of the reference current due to a change in the drain-source voltage Vds thereof, thereby ensuring that the reference current is linear and steady to a first order. The reference current is, thus, provided to the capacitor C1 to charge it and, thus, generate the positive ramping voltage ramp signal Vramp at 304 with the reference current in accordance with the first bias control signals (the PFET bias voltage Pbias and the cascode PFET bias voltage Pbiascc) during a first time period. The current level of the reference current generated by the PFETs M14-16, thus, determines how quickly the voltage on the capacitor C1 at 304 ramps up. Additionally, the voltage on the capacitor C1 at 304 ramps up linearly based on the reference current, which is held constant by the current source due to the NFET M14. Furthermore, immediately prior to the inverted input signal going low, a high voltage for this signal causes the NFET M12 (a first bias transistor, high-side bias transistor, or "bias NFET") to be turned on, so that the voltage level at the node 305 is held or biased to the reference voltage Vss, so the node 305 is not simply floating, before the PFET M16 is turned on. Therefore, when the PFET M16 is turned on (and the NFET M12 is turned off), the voltage ramp signal Vramp starts at the reference voltage Vss when it begins to ramp up. In this manner, the voltage ramp signal Vramp ramps up generally linearly within at least an initial portion thereof from the reference voltage Vss (a lower rail) towards the supply voltage Vdd (an upper rail). When the voltage ramp signal Vramp reaches a threshold voltage (the end of the initial portion of the voltage ramp signal Vramp), the second input buffer 303 switches its state, thereby inverting the delay element input signal (In) and propagating it to the delay element output signal (Out). The remainder of the voltage ramp signal Vramp above the threshold voltage generally does not matter, since the delay element output signal (Out) has already changed state, so any nonlinearity in the voltage ramp signal Vramp above the threshold voltage does not affect the operation of the delay element 300.

Additionally, with the above described configuration of the main delay inverter 302, when the inverted input signal provided by the first inverter buffer 301 goes high (a second state of the inverted input signal), the NFET M17 (i.e., a second or low-side control transistor) turns on (and the PFET M16 turns off), so that the NFETs M17-19 (i.e., second or low-side transistors) are activated (and the PFETs M14-16 are deactivated). The NFET M17, thus, is activated by the second state of the inverted input signal (or in response to the second state of the delay element input signal (In)) and is deactivated by the first state of the inverted input signal (or in response to the first state of the delay element input signal (In)). Activation of the NFET M17 activates the NFETs M17-19 (a second set of transistors) to electrically connect them to the first node of the capacitor C1 at 304 to cause the voltage ramp signal Vramp to ramp down (i.e., with a negative slope). The application of the NFET bias voltage Nbias to the NFET M19 causes the NFET M19 to allow a current to flow therethrough (a second current) that is about the same as the reference current mentioned above, i.e., the reference current is mirrored through the NFET M19, so the NFET M19 (i.e., a second or low-side current source transistor) acts as a current source for the reference current (i.e., the NFETs M17-19 form a second current source when activated). Additionally, the application of the cascode NFET bias voltage Nbiascc to the NFET M18 enables the NFET M18 (i.e., a second or low-side cascode transistor) to serve as a cascode that isolates the capacitor C1 from the PFET M14, thereby isolating the voltage (or voltage change) on the first node of the capacitor C1 at 304 from changing the drain-source voltage Vds on the NFET M19, so that the current source of the NFET M19 does not change the level of the reference current due to a change in the drain-source voltage Vds thereof, thereby ensuring that the reference current is linear and steady to a first order. The reference current is, thus, provided to the capacitor C1 to discharge it and, thus, generate the negative ramping voltage ramp signal Vramp at 304 with the reference current in accordance with the second bias control signals (the NFET bias voltage Nbias and the cascode NFET bias voltage Nbiascc) during a second time period. The current level of the reference current generated by the PFETs M17-19, thus, determines how quickly the voltage on the capacitor C1 ramps down. Additionally, the voltage on the capacitor C1 at 304 ramps down linearly based on the reference current, which is held constant by the current source due to the NFET M19. Furthermore, immediately prior to the inverted input signal going high, a low voltage for this signal causes the PFET M13 (a second bias transistor, low-side bias transistor, or "bias PFET") to be turned on, so that the voltage level at the node 306 is held or biased to the supply voltage Vdd, so the node 306 is not simply floating, before the NFET M17 is turned on. Therefore, when the NFET M17 is turned on (and the PFET M13 is turned off), the voltage ramp signal Vramp starts at the supply voltage Vdd when it begins to ramp down. In this manner, the voltage ramp signal Vramp ramps down generally linearly within at least an initial portion thereof from the supply voltage Vdd (the upper rail) towards the reference voltage Vss (the lower rail). When the voltage ramp signal Vramp reaches the threshold voltage (the end of the initial portion of the voltage ramp signal Vramp), the second input buffer 303 switches its state, thereby inverting the delay element input signal (In) and propagating it to the delay element output signal (Out). The remainder of the voltage ramp signal Vramp below the threshold voltage generally does not matter, since the delay element output signal (Out) has already changed state, so any nonlinearity in the voltage ramp signal Vramp below the threshold voltage does not affect the operation of the delay element 300.

The PFET M20 and NFET M21 of the second inverter buffer 303 represent an output set of transistors that produces the delay element output signal (Out) based on the voltage ramp signal Vramp received from the main delay inverter 302. A source node of the PFET M20 is electrically connected to the supply voltage Vdd, a drain node of the PFET M20 is electrically connected to a drain node of the NFET M21, and a source node of the NFET M21 is electrically connected to the reference voltage Vss. Gate nodes of the PFET M20 and the NFET M21 are electrically connected to receive the voltage ramp signal Vramp. In this configuration, the second inverter buffer 303 produces a logic high for the delay element output signal (Out) when the voltage ramp signal Vramp reaches the threshold voltage as it ramps downward from the supply voltage Vdd toward the reference voltage Vss and produces a logic low for the delay element output signal (Out) when the voltage ramp signal Vramp reaches the threshold voltage as it ramps upward from the reference voltage Vss toward the supply voltage Vdd.

Figure 4:
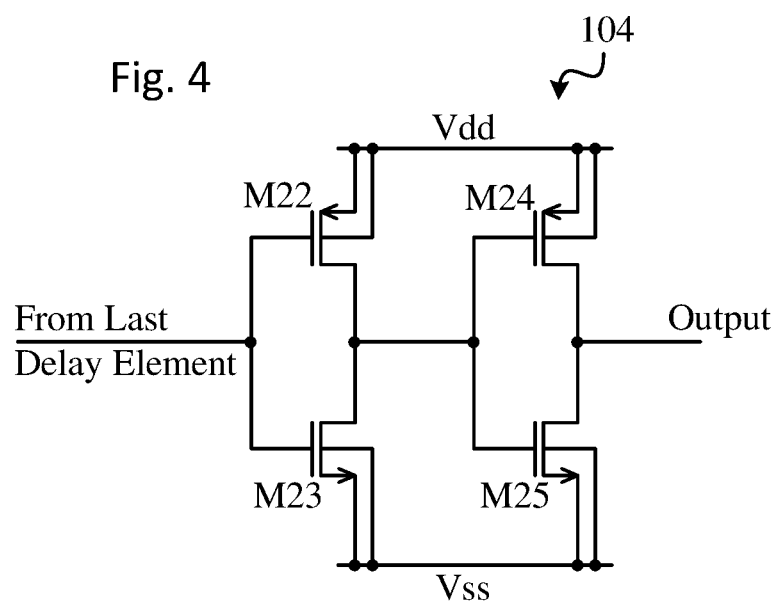
FIG. 4 is a simplified schematic diagram of an output buffer for use in the delay circuit shown in FIG. 1, in accordance with some embodiments.

Additionally, FIG. 4 illustrates an example circuit for the output buffer 104. Other types of buffer elements can also be used. In this example, the output buffer 104 generally includes PFETs M22 and M24 and NFETs M23 and M25. The PFET M22 and the NFET M23 are electrically connected in series from the supply voltage Vdd to the reference voltage Vss, with the source of the PFET M22 electrically connected to the supply voltage Vdd, the drain of the PFET M22 electrically connected to the drain of the NFET M23, and the source of the NFET M23 electrically connected to the reference voltage Vss. The gate nodes of the PFET M22 and the NFET M23 are electrically connected to receive the delay element output signal (Out) from the last delay element 108 of the last delay stage 103 (i.e., a buffer input). The PFET M24 and the NFET M25 are also electrically connected in series from the supply voltage Vdd to the reference voltage Vss, with the source of the PFET M24 electrically connected to the supply voltage Vdd, the drain of the PFET M24 electrically connected to the drain of the NFET M25, and the source of the NFET M25 electrically connected to the reference voltage Vss. The gate nodes of the PFET M24 and the NFET M25 are electrically connected to a node between the drains of the PFET M22 and the NFET M23 to receive an inverted version of the delay element output signal (Out) from the last delay element 108 of the last delay stage 103. The PFET M24 and the NFET M25 re-invert the inverted version of the delay element output signal (Out) from the last delay element 108 to produce the overall output signal at 110.

The contributions of the first inverter buffer 301, the second inverter buffer 303, and the output buffer 104 to the signal delay by the delay element 300 is insignificant. The inverter buffers 301 and 303 of each delay element 300 (i.e., 105-108) generally serve to isolate the main delay inverter 302 to ensure that the main delay inverter 302 receives a relatively fast, clean, full swing input signal and to ensure that the previous delay element 105-107 produces a relatively fast, clean, full swing signal for the subsequent delay element 106-108. Similarly, the output buffer 104 ensures that the delay element output signal (Out) is a clean signal.

With the above described configurations of the reference current generator 101 and delay element 300 (i.e., for the delay elements 105-108), the following equations illustrate calculations for determining the overall delay time period for the delay circuit 100. A divided reference voltage Vref is given by:

$$Vref = Vdd \times M, \qquad \text{Eq. 1}$$

where M is the divider ratio of the voltage divider formed by the voltage divider resistors R1 and R2. Thus, the divided reference voltage Vref is the voltage at the node electrically connected to the negative input of the op amp 201 and to the gate nodes of PFETs M2, M4 and M7, i.e., the divided reference voltage Vref is the cascode PFET bias voltage Pbiascc.

If the voltage divider resistors R1 and R2 have the same resistance, then the divider ratio M is ½. In this case, the above-mentioned reference current Iref is given by:

$$Iref = Vref/R = Vdd/(2R), \qquad \text{Eq. 2}$$

where R is the resistance of the reference resistor Rref. Since the reference current Iref is mirrored in the main delay inverter 302 to both charge and discharge the capacitor C1, the general equation for the current of a capacitor:

$$I = CdV/dt, \qquad \text{Eq. 3}$$

results in:

$$CdV/dt = Vdd/(2R), \qquad \text{Eq. 4}$$

where C is the capacitance of the delay element capacitor C1.

Therefore, when the delay element 105-108 ramps up the voltage ramp signal Vramp and charges the delay element capacitor C1, the element delay time period "dtup" for this delay element is given by:

$$dtup=(C \times dV \times R)/Vref=(2 \times C \times R \times Vth)/Vdd, \quad \text{Eq. 5}$$

and when the delay element 105-108 ramps down the voltage ramp signal Vramp and discharges the delay element capacitor C1, the element delay time period "dtdn" for this delay element is given by:

$$dtdn=(C \times dV \times R)/Vref=(2 \times C \times R \times (Vdd-Vth))/Vdd, \quad \text{Eq. 6}$$

where Vth is the above-mentioned threshold voltage for the first inverter buffer 301, the main delay inverter 302 and the second inverter buffer 303, and the reference voltage Vss is ground.

Therefore, the stage delay time period Ts for each delay stage 102 or 103 (i.e., for two delay elements 105/106 or 107/108) is given by:

$$Ts=dtup+dtdn=(2 \times C \times R \times Vth)/Vdd+(2 \times C \times R \times (Vdd-Vth))/Vdd. \quad \text{Eq. 7}$$

Equation 7 can be reformulated as:

$$Ts=(2 \times C \times R \times Vth)/Vdd+(2 \times C \times R \times Vdd)/Vdd-(2 \times C \times R \times Vth)/Vdd, \quad \text{Eq. 8}$$

in which the first term and the last term cancel each other, and Vdd is cancelled in the middle term. Thus, the stage delay time period Ts for one delay stage 102 or 103 (or two delay elements 105/106 or 107/108) reduces to:

$$Ts=2RC. \quad \text{Eq. 9}$$

Therefore, the overall delay time period $T_O$ for the delay circuit 100 that has two delay stages 102 and 103 (i.e., four delay elements 105, 106, 107 and 108) is:

$$T_O=4RC. \quad \text{Eq. 10}$$

Additionally, the element delay time period Te for a single delay element is the value RC if the delay elements 105-108 are substantially identical to each other, e.g., with no processing variations.

As is apparent from the above calculations, since the supply voltage Vdd and the threshold voltage Vth cancel out, the delay time period Ts for a single delay stage 102 or 103 (having two delay elements 105/106 or 107/108) is generally first order independent of the supply voltage Vdd and the inverter threshold voltage Vth. Therefore, although there may be second order error due to circuit limitations, the stage delay time period Ts (and the overall delay time period $T_O$ for the delay circuit 100) is substantially dependent only on the resistance R of the reference resistor Rref and the capacitance C of the delay element capacitor C1. This independence from the supply voltage Vdd and the inverter threshold voltage Vth results in the delay circuit 100 being substantially independent, immune or tolerant to noise fluctuations in the voltages in the delay circuit 100.

Figure 5:
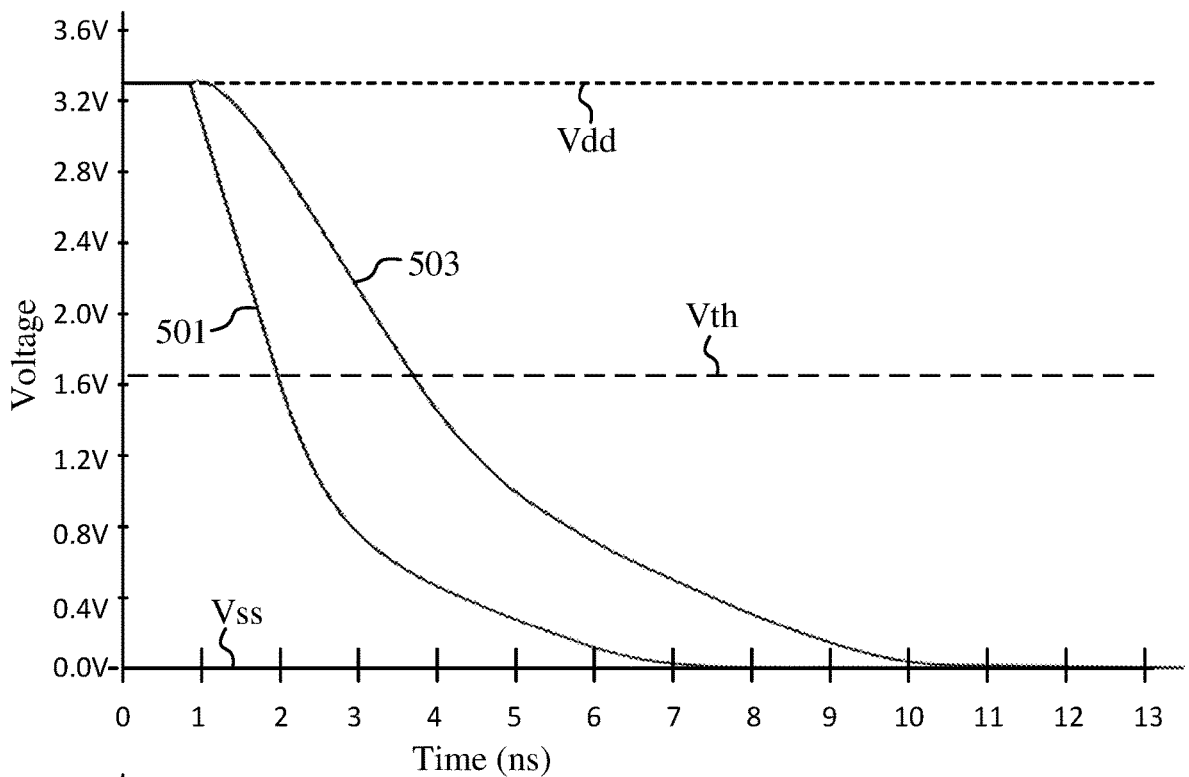
FIG. 5 shows waveforms illustrating an operation of a portion of the delay element shown in FIG. 3, in accordance with some embodiments.
Figure 5:
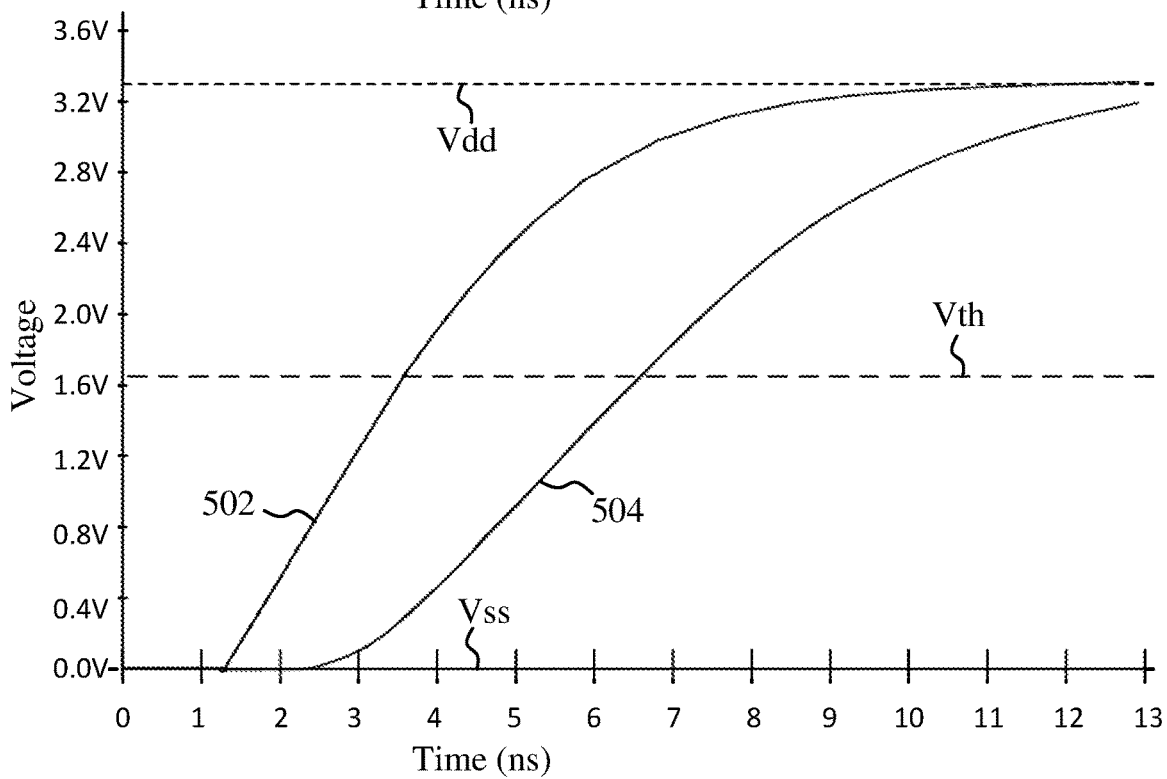

FIG. 5 shows graphs generated in a simulation of the delay circuit 100 that illustrate the effects of the bias NFET M12 and the bias PFET M13 in the operation of the delay element 300 (i.e., 105-108). The graph 501 shows the voltage ramp signal Vramp for the delay element 300 (i.e., 105-108) with the bias FETs M12 and M13 included in the circuit when the voltage ramp signal Vramp is ramping down. The graph 502 shows the voltage ramp signal Vramp for the delay element 300 (i.e., 105-108) with the bias FETs M12 and M13 included in the circuit when the voltage ramp signal Vramp is ramping up. The graph 503 shows the voltage ramp signal Vramp for the delay element 300 (i.e., 105-108) without the bias FETs M12 and M13 included in the circuit when the voltage ramp signal Vramp is ramping down. The graph 504 shows the voltage ramp signal Vramp for the delay element 300 (i.e., 105-108) without the bias FETs M12 and M13 included in the circuit when the voltage ramp signal Vramp is ramping up. Also shown are the reference voltage Vss (i.e., ground), the supply voltage Vdd, and the inverter threshold voltage Vth. Additionally, the inverter threshold voltage Vth for this example results when the process of forming the PFETs and the NFETs is not skewed to produce either the PFETs or the NFETs larger than the other (i.e., when processing results in the PFETs and the NFETs in the circuit being relatively similar), so the PFETs and NFETs are sized such that the inverter threshold voltage Vth is near the midpoint between the reference voltage Vss and the supply voltage Vdd, i.e., Vth=Vdd/2.

As can be seen in the graph 501, the voltage ramp signal Vramp starts at almost exactly the voltage level of the rail of the supply voltage Vdd and immediately ramps downward substantially linearly at least as far as the voltage level of the inverter threshold voltage Vth. At some point after passing below the inverter threshold voltage Vth, the graph 501 begins to curve, so that it is no longer linear. By contrast, as can be seen in the graph 503, without the bias PFET M13, the voltage ramp signal Vramp exhibits a slight fluctuation above the level of the supply voltage Vdd, then curves nonlinearly before entering a somewhat more linear portion as it approaches the inverter threshold voltage Vth, and then curves nonlinearly below the inverter threshold voltage Vth. With the bias PFET M13, therefore, the graph 501 shows the response of the voltage ramp signal Vramp when the bias PFET M13 biases or preconditions the voltage ramp signal Vramp to the voltage level of the supply voltage Vdd before the bias PFET M13 is turned off and the NFET M17 is turned on to cause the voltage ramp signal Vramp to begin to ramp down. Additionally, the cascode NFET M18 causes the voltage ramp signal Vramp to be substantially linear during the initial portion of the voltage ramp signal Vramp, i.e., at least from the supply voltage Vdd down to the inverter threshold voltage Vth (and somewhat below) before curving nonlinearly. The nonlinear portion of the response of the voltage ramp signal Vramp (of graph 501) below the inverter threshold voltage Vth does not affect the operation of the delay element 300, because the delay element output signal (Out) produced by the second inverter buffer 303 already changed state when the voltage ramp signal Vramp crossed the inverter threshold voltage Vth.

Similarly, as can be seen in the graph 502, the voltage ramp signal Vramp starts at almost exactly the voltage level of the rail of the reference voltage Vss and immediately ramps upward substantially linearly at least as far as the voltage level of the inverter threshold voltage Vth. At some point after passing above the inverter threshold voltage Vth, the graph 502 begins to curve, so that it is no longer linear. By contrast, as can be seen in the graph 504, without the bias NFET M12, the voltage ramp signal Vramp exhibits a slight fluctuation below the level of the reference voltage Vss, then curves nonlinearly before entering a somewhat more linear portion as it approaches the inverter threshold voltage Vth, and then curves nonlinearly above the inverter threshold voltage Vth. With the bias NFET M12, therefore, the graph 502 shows the response of the voltage ramp signal Vramp when the bias NFET M12 biases or preconditions the voltage ramp signal Vramp to the voltage level of the reference voltage Vss before the bias NFET M12 is turned off and the PFET M16 is turned on to cause the voltage ramp signal Vramp to begin to ramp up. Additionally, the cascode PFET M15 causes the voltage ramp signal Vramp to be substantially linear during the initial portion of the voltage ramp signal Vramp, i.e., at least from the reference voltage Vss up to the inverter threshold voltage Vth (and somewhat above) before curving nonlinearly. The nonlinear portion of the response of the voltage ramp signal Vramp (of graph 502) above the inverter threshold voltage Vth does not affect the operation of the delay element 300, because the delay element output signal (Out) produced by the second inverter buffer 303 already changed state when the voltage ramp signal Vramp crossed the inverter threshold voltage Vth.

As indicated by the graphs 501 and 502 and the example calculation above (Equations 1-10), the delay caused by the main delay inverter 302 is linearly proportional to the resistance R of the reference resistor Rref (as well as to the capacitance C of the delay element capacitor C1) due to the linear portion of the voltage ramp signal Vramp before the graphs 501 and 502 cross the inverter threshold voltage Vth. In some embodiments, therefore, the element delay time period Te for each delay element 105-108 (and, thus, the stage delay time period Ts for each delay stage 102 and 103 and the overall delay time period $T_O$ for the delay circuit 100) can be set by selecting a resistor for the reference resistor Rref for each delay element 105-108. The linearity of the relevant initial portion of the voltage ramp signal Vramp enables a simple calculation to determine the necessary resistance for the reference resistor Rref based on the desired overall delay time period $T_O$. Additionally, if the delay circuit 100 is formed in a single integrated circuit (IC) chip, except for the reference resistor Rref, then a designer or manufacturer of an overall electronic circuit in which the delay circuit 100 is a component can incorporate the delay circuit 100 into the overall design by simply selecting the appropriate external reference resistor Rref to be electrically connected to the IC chip for the delay circuit 100.

The above-described configuration for the delay circuit 100 can be used to improve pulse stability within an overall electronic circuit, especially for very short pulses on the order of 1-5 nsec. The signal delay (a simple multiple of RC) is stable over manufacturing process and supply voltage Vdd. The reference current used therein generally tracks the supply voltage Vdd. The delay circuit 100 generally includes a current controlled inverter with rail control to improve linearity. These advantages are illustrated by FIGS. 6-13.

Figure 6:
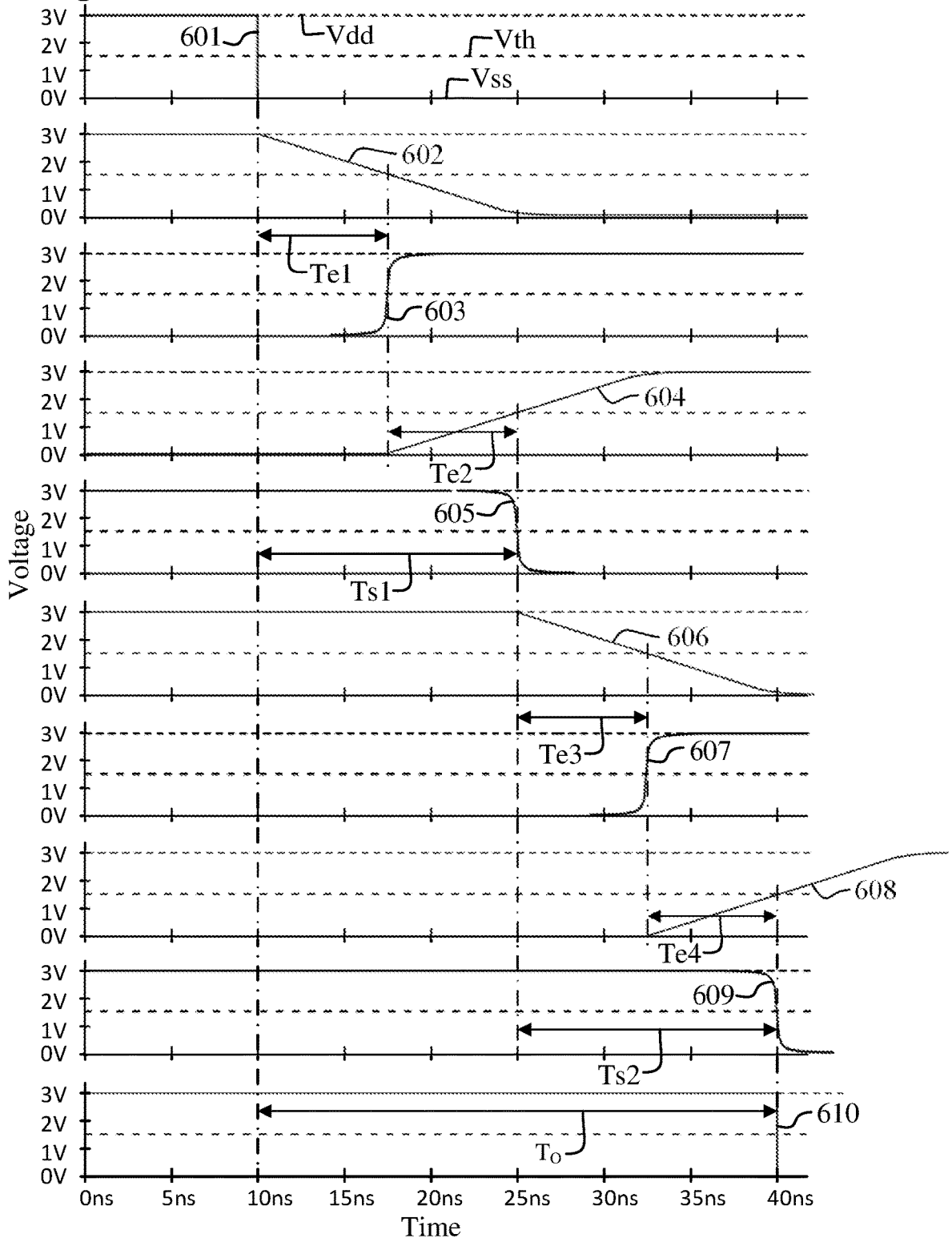
FIGS. 6-13 show waveforms illustrating operations of portions of the delay circuit shown in FIG. 1, in accordance with some embodiments.

FIG. 6 shows idealized waveforms (graphs 601-610) based on a simulation of the delay circuit 100 illustrating example operations of components of the delay circuit 100, in accordance with some embodiments. In this example, the reference voltage Vss=ground, and the supply voltage Vdd=3V. The inverter threshold voltage Vth=1.5V (or Vdd/2), since the PFETs and NFETs are typical MOSFETs that have undergone approximately the same processing to be sized approximately the same.

Additionally, the delay circuit 100 for this example has the two delay stages 102 and 103 for four delay elements 105-108. Furthermore, the reference resistor Rref has a resistance R of 75 kOhms, and the delay element capacitor C1 has a capacitance C of 100 femtofarads, so the product RC has a value of 7.5 ns. Therefore, the calculated value for each stage delay time period Ts1 and Ts2=2RC=15 ns. With two delay stages (i.e., four delay elements), the calculated value for the overall delay time period $T_O$=4RC=30 ns.

The graph 601 is an example of the overall input signal at 109, which is the delay element input signal (In) for the first delay element 105 of the first delay stage 102. The graph 602 is an example of the voltage ramp signal Vramp for the first delay element 105 of the first delay stage 102. The graph 603 is an example of the delay element output signal (Out) for the first delay element 105 of the first delay stage 102, which is the delay element input signal (In) for the second delay element 106 of the first delay stage 102. The graph 604 is an example of the voltage ramp signal Vramp for the second delay element 106 of the first delay stage 102. The graph 605 is an example of the delay element output signal (Out) for the second delay element 106 of the first delay stage 102, which is the delay element input signal (In) for the first delay element 107 of the second delay stage 103. The graph 606 is an example of the voltage ramp signal Vramp for the first delay element 107 of the second delay stage 103. The graph 607 is an example of the delay element output signal (Out) for the first delay element 107 of the second delay stage 103, which is the delay element input signal (In) for the second delay element 108 of the second delay stage 103. The graph 608 is an example of the voltage ramp signal Vramp for the second delay element 108 of the second delay stage 103. The graph 609 is an example of the delay element output signal (Out) for the second delay element 108 of the second delay stage 103, which is the buffer input for the output buffer 104. The graph 610 is, thus, the overall output signal at 110. Additionally, the reference voltage Vss, the supply voltage Vdd and the inverter threshold voltage Vth are labeled only for the first waveform (graph 601) for simplicity but are the same for each waveform (graphs 601-610).

When the overall input signal at 109 (graph 601) transitions its state (e.g., high to low, as shown), the state transition propagates through to the main delay inverter 302 in the first delay element 105 of the first delay stage 102, which causes the voltage ramp signal Vramp (graph 602) to start changing its state (e.g., ramping downward, as shown). In this example, this occurs at about the 10 ns point. When the voltage ramp signal Vramp (graph 602) crosses the inverter threshold voltage Vth, the delay element output signal (Out) (graph 603) for the first delay element 105 of the first delay stage 102 transitions its state (e.g., low to high, as shown). In this example, this occurs at about the 17.5 ns point, so the first element delay time period Te1 for the first delay element 105 of the first delay stage 102 is approximately 7.5 ns. Also, the state transition for the delay element output signal (Out) (graph 603) for the first delay element 105 of the first delay stage 102 propagates through to the main delay inverter 302 in the second delay element 106 of the first delay stage 102, which causes the voltage ramp signal Vramp (graph 604) to start changing its state (e.g., ramping upward, as shown). When the voltage ramp signal Vramp (graph 604) crosses the inverter threshold voltage Vth, the delay element output signal (Out) (graph 605) for the second delay element 106 of the first delay stage 102 transitions its state (e.g., high to low, as shown). In this example, this occurs at about the 25 ns point, so the second element delay time period Te2 for the second delay element 106 of the first delay stage 102 is also approximately 7.5 ns. Also, the state transition for the delay element output signal (Out) (graph 605) for the second delay element 106 of the first delay stage 102 propagates through to the main delay inverter 302 in the first delay element 107 of the second delay stage 103, which causes the voltage ramp signal Vramp (graph 606) to start changing its state (e.g., ramping downward, as shown). When the voltage ramp signal Vramp (graph 606) crosses the inverter threshold voltage Vth, the delay element output signal (Out) (graph 607) for the first delay element 107 of the second delay stage 103 transitions its state (e.g., low to high, as shown). In this example, this occurs at about the 32.5 ns point, so the third element delay time period Te3 for the first delay element 107 of the second delay stage 103 is also approximately 7.5 ns. Also, the state transition for the delay element output signal (Out) (graph 607) for the first delay element 107 of the second delay stage 103 propagates through to the main delay inverter 302 in the second delay element 108 of the second delay stage 103, which causes the voltage ramp signal Vramp (graph 608) to start changing its state (e.g., ramping upward, as shown). When the voltage ramp signal Vramp (graph 608) crosses the inverter threshold voltage Vth, the delay element output signal (Out) (graph 609) for the second delay element 108 of the second delay stage 103 transitions its state (e.g., high to low, as shown). In this example, this occurs at about the 40 ns point, so the fourth element delay time period Te4 for the second delay element 108 of the second delay stage 103 is also approximately 7.5 ns. Additionally, the state transition for the delay element output signal (Out) (graph 609) for the second delay element 108 of the second delay stage 103 propagates through the output buffer 104 to produce the overall output signal at 110 (graph 610), which occurs sufficiently fast for the overall output signal at 110 to be at approximately 40 ns.

In this example, the element delay time periods Te1-Te4 (7.5 ns) are all about the same as each other, since the PFETs and NFETs are typical MOSFETs that have undergone approximately the same processing to be sized approximately the same. Thus, the first and second stage delay time periods Ts1 and Ts2 (15 ns) for the first and second delay stages 102 and 103, respectively, are also about the same as each other, where Ts1=Te1+Te2, and Ts2=Te3+Te4. The value for each stage delay time period Ts1 and Ts2=15 ns is the same as the calculated value for 2RC given above. Additionally, the overall delay time period $T_O$ (30 ns) for the delay circuit 100 is shown, where $T_O$=Ts1+Ts2. The value for the overall delay time period $T_O$=30 ns is the same as the calculated value for 4RC given above. This relationship between the product RC and the delay time periods holds regardless of the value of the resistance R, since the delay time periods are linearly proportional to the resistance due to operation of the delay elements 105-108 within the initial linear portion of the voltage ramp signal Vramp.

Similar to FIG. 6, FIGS. 7-9 show idealized waveforms 700, 800 and 900 based on simulations of the delay circuit 100 illustrating example operations of components of the delay circuit 100, in accordance with some embodiments. For each of the examples in FIGS. 7-9, the supply voltage Vdd is increased, e.g., Vdd=5V in FIG. 7, Vdd=8V in FIG. 8, and Vdd=10V in FIG. 9. All other parameters for the delay circuit 100 are held the same as those for the example of FIG. 6. These examples, thus, illustrate the effect of changing the supply voltage Vdd (and the consequent changing of the inverter threshold voltage Vth) on the operation of the delay circuit 100.

Figure 7:
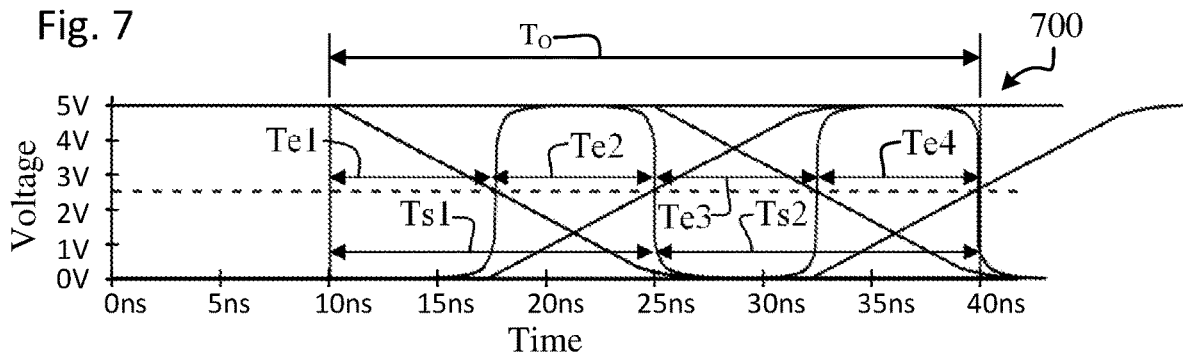
Figure 8:
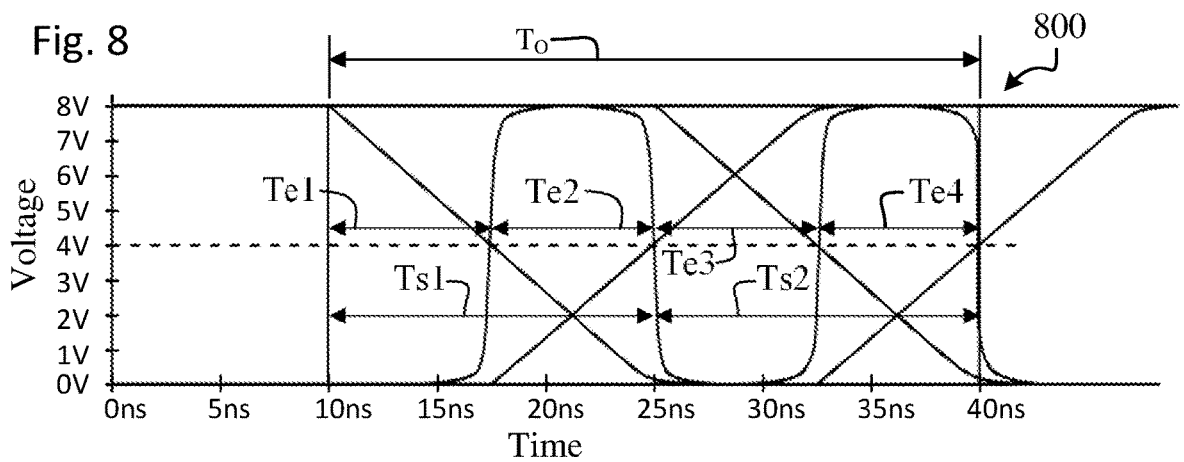
Figure 9:
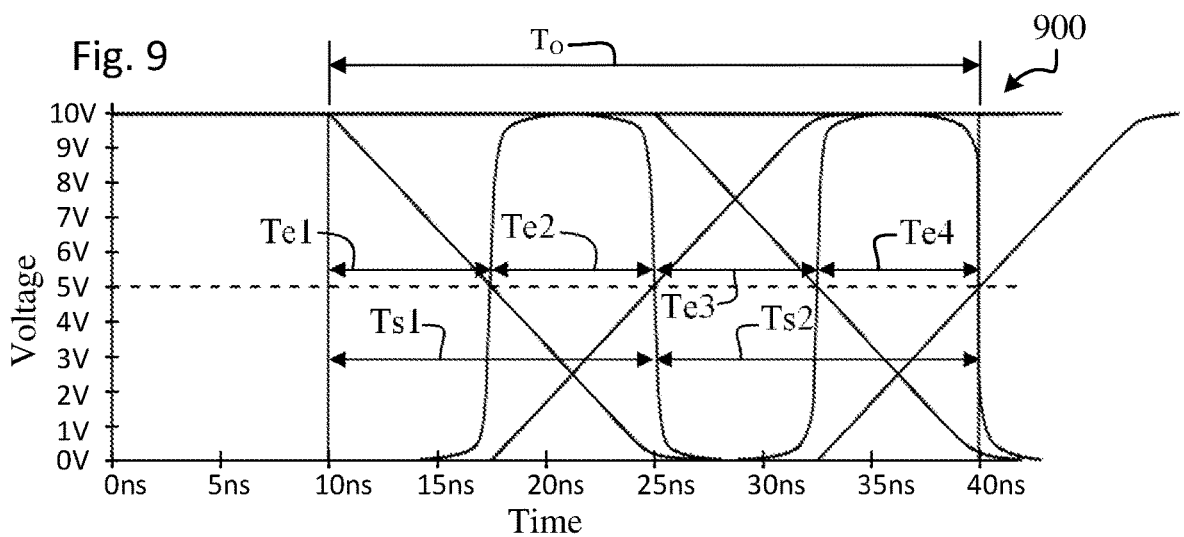

The waveforms 700, 800 and 900 in FIGS. 7-9 correspond to similar waveforms in FIG. 6, e.g., from the overall input signal at 109 (graph 601) to the overall output signal at 110 (graph 610). Therefore, the descriptions of the waveforms 700, 800 and 900 in FIGS. 7-9 are generally the same as those provided above for graphs 601-610. However, the waveforms 700, 800 and 900 in FIGS. 7-9 are not labeled with individual reference numbers, so that the waveforms 700, 800 and 900 are easier to view with fewer obstructions. On the other hand, the element delay time periods Te1-4, the stage delay time periods Ts1 and Ts2, and the overall delay time period $T_O$ are labeled.

As can be seen with respect to the time scale provided for the waveforms 700, 800 and 900, the element delay time periods Te1-4 in the examples of FIGS. 7-9 are about the same as the element delay time periods Te1-4 in the example of FIG. 6, i.e., 7.5 ns. Therefore, the stage delay time periods Ts1 and Ts2 and the overall delay time period $T_O$ in the examples of FIGS. 7-9 are also about the same as the stage delay time periods Ts1 and Ts2 and the overall delay time period $T_O$ in the example of FIG. 6, i.e., Ts1 and Ts2=15 ns and $T_O$=30 ns. In other words, changes in the supply voltage Vdd do not substantially affect the resulting delay time periods for the delay elements 105-108, the delay stages 102 and 103, and the delay circuit 100. Therefore, the operation of the delay circuit 100 is independent of the voltage level of the supply voltage Vdd, and the relationship between the delay time periods and the product RC remains the same.

This independence from the supply voltage Vdd occurs because the reference current generated by the reference current generator 101 increases and decreases linearly with increases and decreases, respectively, of the supply voltage Vdd. Thus, when the supply voltage Vdd increases or decreases, the reference current mirrored in the main delay inverter 302 of each delay element 105-108 also increases or decreases, respectively, in direct proportion thereto. The increase or decrease in the mirrored reference current in the main delay inverter 302 causes the voltage ramp signal Vramp to ramp (whether up or down) faster or slower, respectively. Additionally, the increase or decrease of the supply voltage Vdd results in a corresponding increase or decrease, respectively, of the inverter threshold voltage Vth. Therefore, although the voltage ramp signal Vramp is ramping faster or slower, it has a longer or shorter, respectively, way to go to cross the inverter threshold voltage Vth. As a result, the time period for the voltage ramp signal Vramp to ramp from the rail (Vdd or Vss) to cross the inverter threshold voltage Vth stays the same, so the element delay time periods Te1-4, the stage delay time periods Ts1 and Ts2, and the overall delay time period $T_O$ are about the same for different voltage levels of the supply voltage Vdd. Therefore, the same delay circuit 100 can be used in different overall electronic circuit designs having different supply voltages Vdd but still produce the same delay time period, dependent only on the resistance R of the reference resistor Rref (as well as on the capacitance C of the delay element capacitor C1), as explained above. Additionally, this independence from the supply voltage Vdd enables the delay circuit 100 to be used in a relatively noisy overall electronic circuit design environment, i.e., with fluctuations in the supply voltage Vdd therein, without significantly affecting the delay time periods generated by the delay circuit 100.

Figure 10:
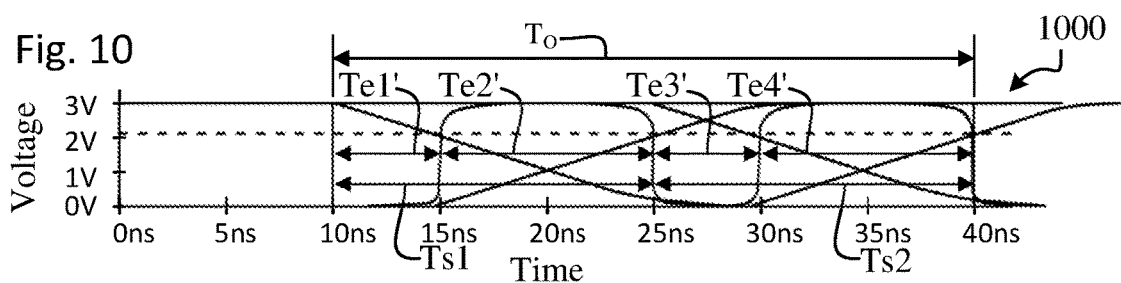
Figure 11:
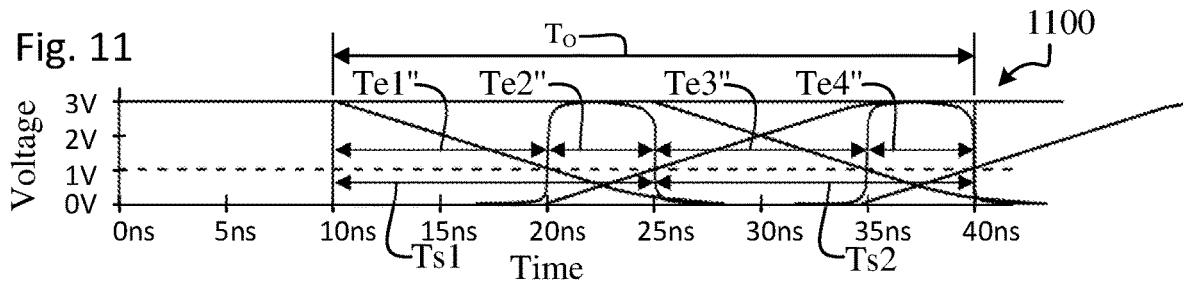
Figure 12:
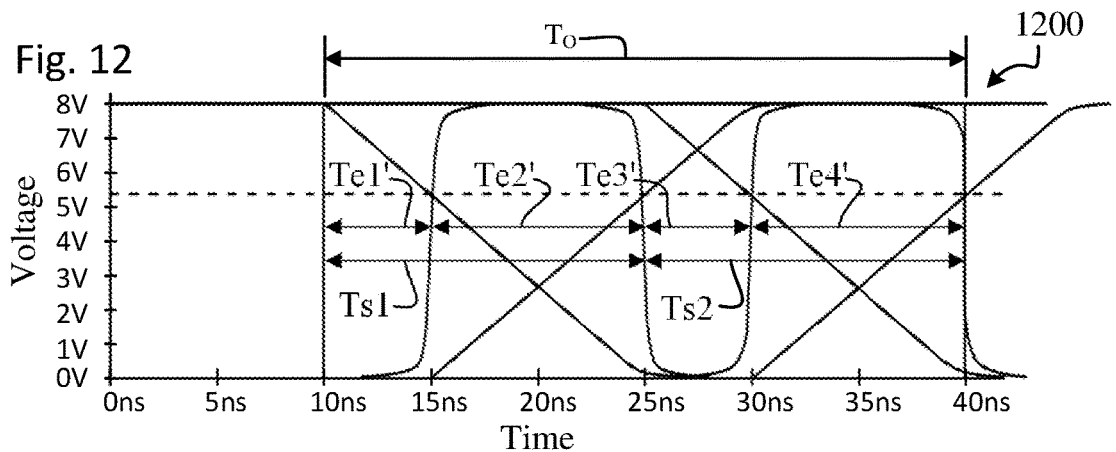
Figure 13:
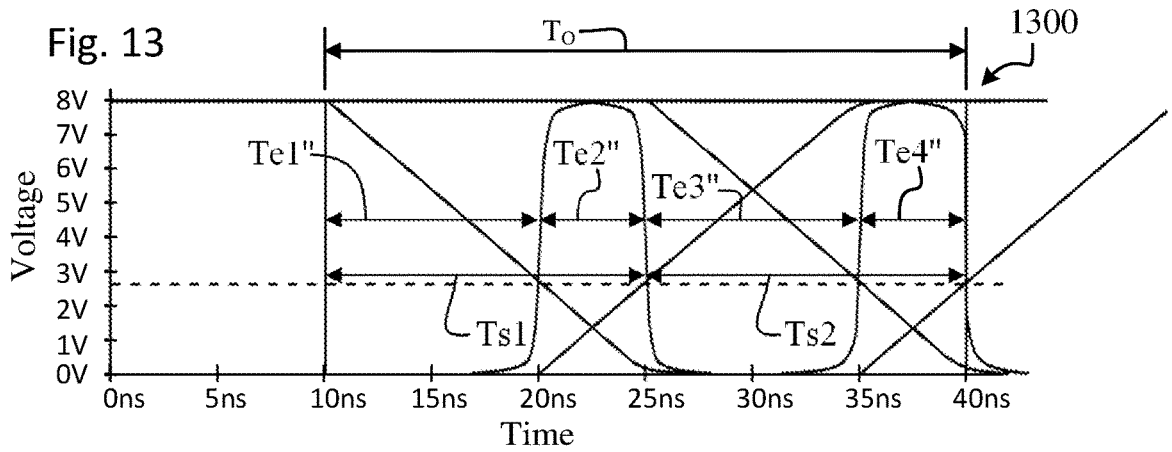

Similar to FIG. 6, FIGS. 10-13 show idealized waveforms 1000, 1100, 1200 and 1300 based on simulations of the delay circuit 100 illustrating example operations of components of the delay circuit 100, in accordance with some embodiments. However, the examples of FIGS. 10-13 illustrate the effect of different supply voltages Vdd as well as manufacturing process variations (e.g., resulting in the PFET devices being larger/faster or smaller/slower than the NFET devices) on the operation of the delay circuit 100, whether the process variations and PFET/NFET performance differences are intentional and significant or merely incidental and relatively minor. The examples of FIGS. 10 and 12 illustrate the delay for strong or fast PMOS devices relative to the NMOS devices (which results in the inverter threshold Vth being relatively high) with a supply voltage Vdd of 3V in FIG. 10 and 8V in FIG. 12. On the other hand, the examples of FIGS. 11 and 13 illustrate the delay for strong or fast NMOS devices relative to the PMOS devices (which results in the inverter threshold Vth being relatively low) with a supply voltage Vdd of 3V in FIG. 11 and 8V in FIG. 13.

The waveforms 1000, 1100, 1200 and 1300 in FIGS. 10-13 correspond to similar waveforms in FIG. 6, e.g., from the overall input signal at 109 (graph 601) to the overall output signal at 110 (graph 610). Therefore, the descriptions of the waveforms 1000, 1100, 1200 and 1300 in FIGS. 10-13 are generally the same as those provided above for graphs 601-610, albeit with some timing variations. However, the waveforms 1000, 1100, 1200 and 1300 in FIGS. 10-13 are not labeled with individual reference numbers, so that the waveforms 1000, 1100, 1200 and 1300 are easier to view with fewer obstructions. On the other hand, the element delay time periods Te1'-Te4' and Te1"-Te4", the stage delay time periods Ts1 and Ts2, and the overall delay time period $T_O$ are labeled.

As can be seen with respect to the time scale provided for the waveforms 1000, 1100, 1200 and 1300, the element delay time periods Te1'-Te4' and Te1"-Te4" in the examples of FIGS. 10-13 are different from the element delay time periods Te1-4 in the example of FIG. 6. In these examples, the element delay time periods Te1' and Te3' in FIGS. 10 and 12 and the element delay time periods Te2" and Te4" in FIGS. 11 and 13 are about 5 ns. On the other hand, the element delay time periods Te2' and Te4' in FIGS. 10 and 12 and the element delay time periods Te1" and Te3" in FIGS. 11 and 13 are about 20 ns. In other words, the examples with the fast PMOS devices (with the inverter threshold Vth being relatively high) in FIGS. 10 and 12 result in the element delay time periods Te1' and Te3' being shorter when the voltage ramp signal Vramp ramps downward and the element delay time periods Te2' and Te4' being longer when the voltage ramp signal Vramp ramps upward. On the other hand, the examples with the fast NMOS devices (with the inverter threshold Vth being relatively low) in FIGS. 11 and 13 result in the element delay time periods Te1" and Te3" being longer when the voltage ramp signal Vramp ramps downward and the element delay time periods Te2" and Te4" being shorter when the voltage ramp signal Vramp ramps upward.

However, the differences in the shorter and longer element delay time periods Te1'-Te4' and Te1"-Te4" result in the stage delay time periods Ts1 and Ts2 and the overall delay time period $T_O$ in the examples of FIGS. 10-13 being about the same as the stage delay time periods Ts1 and Ts2 and the overall delay time period $T_O$ in the example of FIG. 6, i.e., Ts1 and Ts2=15 ns and $T_O$=30 ns. In other words, in some embodiments, by using the delay elements 105-108 in pairs (i.e., two delay elements in each delay stage 102 and 103), the effects due to process variations on the individual element delay time periods Te1'-Te4' and Te1"-Te4" cancel each other out at the level of the stage delay time periods Ts1 and Ts2 and the overall delay time period $T_O$, so the relationship between the delay time periods Ts1, Ts2 and $T_O$ and the calculated product RC remains the same, even though the element delay time periods Te1'-Te4' and Te1"-Te4" are not related to the product RC. Therefore, the operation of the delay circuit 100 is independent of such process variations for embodiments using the delay elements 105-108 in pairs within the delay stages 102 and 103. Thus, even if there are no intentional process variations between the PFET devices and the NFET devices of the delay circuit 100, using the delay elements 105-108 in pairs within the delay stages 102 and 103 will ensure that any merely incidental or relatively minor differences between the PFET devices and the NFET devices will not affect the overall operation of the delay circuit 100.

Additionally, the element delay time periods Te1'-Te4', the stage delay time periods Ts1 and Ts2, and the overall delay time period $T_O$ are the same in FIGS. 10 and 12 even though the supply voltages Vdd are different in these examples, i.e., Vdd=3V in FIG. 10 versus Vdd=8V in FIG. 12. Similarly, the element delay time periods Te1"-Te4", the stage delay time periods Ts1 and Ts2, and the overall delay time period $T_O$ are the same in FIGS. 11 and 13 even though the supply voltages Vdd are different in these examples, i.e., Vdd=3V in FIG. 11 versus Vdd=8V in FIG. 13. In other words, the operation of the delay circuit 100 is independent of the voltage level of the supply voltage Vdd, as mentioned above, even in the presence of process variations. Additionally, this independence from supply voltage Vdd and process variations is applicable to the delay circuit 100 operations when the overall input signal at 109 transitions with either a falling edge (as illustrated in FIGS. 6-13) or a rising edge.

As noted above, there are no memory elements in the delay circuit 100. As such, the delay circuit 100 simply propagates an edge therethrough as an analog signal. Therefore, it is not possible for a component of the delay circuit 100 to end up in a wrong state. This fact, thus, contributes to the noise-tolerance of the delay circuit 100.

Figure 14:
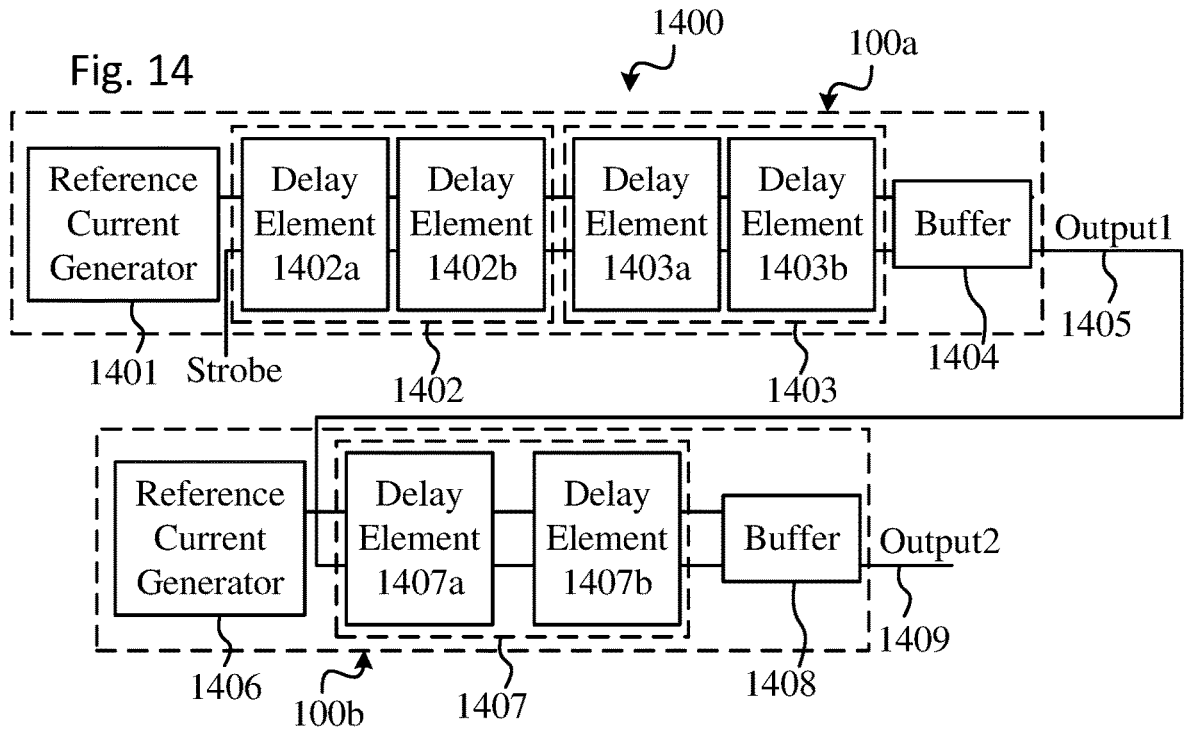
FIG. 14 is a simplified schematic diagram of a portion of a circuit illustrating an example application of the delay circuit shown in FIG. 1, in accordance with some embodiments.
Figure 15:
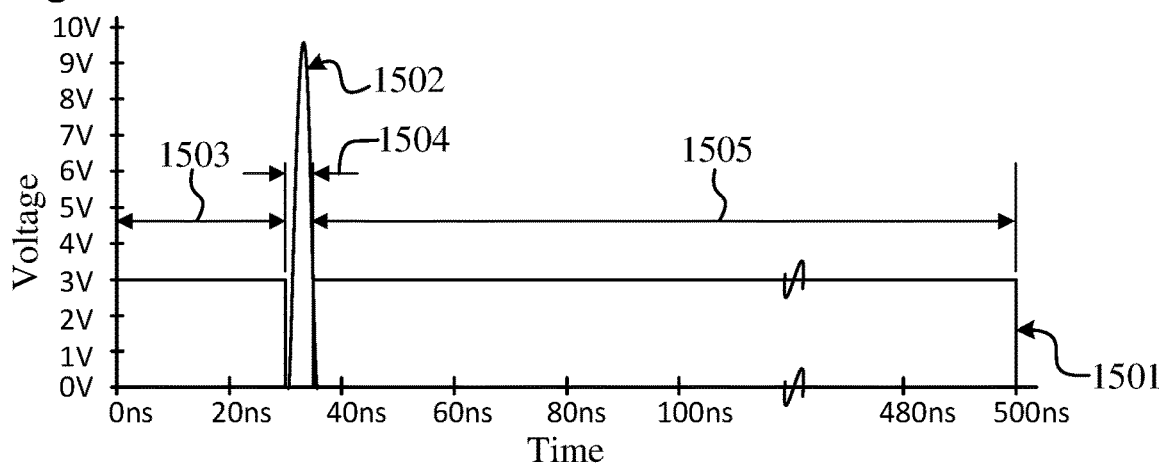
FIG. 15 shows timing diagrams illustrating an operation of the example application shown in FIG. 14, in accordance with some embodiments.

An example application for the delay circuit 100 is illustrated by FIGS. 14 and 15. An example circuit 1400 is shown in FIG. 14, and timing diagrams 1501 and 1502 illustrating the operation and usage of the example circuit 1400 are shown in FIG. 15. For this example, the example circuit 1400 includes two delay circuits 100a and 100b that have structure and operation similar to that of the delay circuit 100, except as described hereinafter. The first delay circuit 100a generally includes two delay stages 1402 and 1403 (similar to the delay stages 102 and 103, and each having two delay elements 1402a-b and 1403a-b, respectively) in addition to a reference current generator 1401 (similar to the reference current generator 101) and an output buffer 1404 (similar to the output buffer 104). On the other hand, the second delay circuit 100b generally includes only one delay stage 1407 (similar to the delay stages 102 and 103, and having two delay elements 1407a-b) in addition to a reference current generator 1406 (similar to the reference current generator 101) and an output buffer 1408 (similar to the output buffer 104).

The example circuit 1400 is included within an overall circuit (not shown) for generating a relatively short duration pulse signal shown by the timing diagram 1502. The first delay circuit 100a is used to time a preflux period (portion 1503 of the timing diagram 1501) for the pulse, and the second delay circuit 100b is used to time the pulse period (portion 1504 of the timing diagram 1501) for the pulse. The overall circuit may use a clock signal for timing between pulses. For this example, a strobe signal (e.g., provided by the clock signal) is provided for the overall input signal to the first delay circuit 100a. A time period of a high portion of the clock signal may, therefore, be used to charge a capacitor (not shown) for generating the pulse. A falling edge of the clock signal may, thus, start the delay time generated by the first delay circuit 100a to time the preflux period before generating the pulse. For this example, the reference resistor Rref for the delay elements 1402a-b and 1403a-b has a resistance of 75 kOhms, and the delay element capacitor C1 has a capacitance of 100 fF, so the product RC is 7.5 ns, and the overall delay time period $T_O$=4RC=30 ns, as shown by the portion 1503 of the timing diagram 1501. The overall output signal Output1 at 1405 for the first delay circuit 100a is, thus, a 30 ns delayed version of the input strobe signal, and is used to start the pulse period (portion 1504 of the timing diagram 1501) for the overall circuit to generate the pulse shown by the timing diagram

1502. Also, for this example, the reference resistor Rref for the delay elements 1407*a-b* has a resistance of 25 kOhms, and the delay element capacitor C1 has a capacitance of 100 fF, so the product RC is 2.5 ns, and the overall delay time period $T_O$=2RC=5 ns, as shown by the portion 1504 of the timing diagram 1501. The overall output signal Output2 at 1409 for the second delay circuit 100*b* is, thus, a 5 ns delayed version of the overall output signal Output1 at 1405, and is used to end the pulse period (portion 1504 of the timing diagram 1501) for the overall circuit to generate the pulse shown by the timing diagram 1502. A remaining portion 1505 of the timing diagram 1501 may be determined by the end of the low portion of the clock signal, and generally represents a discharge time period for ensuring that the capacitor (for generating the pulse) is fully discharged.

The delay circuit 100 may also be used in any other appropriate application in which it is necessary to generate a delay signal with a high degree of noise tolerance and independence from the supply voltage Vdd, a temperature of the delay circuit, and process variations that affect the threshold voltage.

Reference has been made in detail to embodiments of the disclosed invention, one or more examples of which have been illustrated in the accompanying figures. Each example has been provided by way of explanation of the present technology, not as a limitation of the present technology. In fact, while the specification has been described in detail with respect to specific embodiments of the invention, it will be appreciated that those skilled in the art, upon attaining an understanding of the foregoing, may readily conceive of alterations to, variations of, and equivalents to these embodiments. For instance, features illustrated or described as part of one embodiment may be used with another embodiment to yield a still further embodiment. Thus, it is intended that the present subject matter covers all such modifications and variations within the scope of the appended claims and their equivalents. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

What is claimed is:

1. A delay circuit comprising:
   a delay element that comprises:
   an input configured to receive an input signal;
   an output configured to produce an output signal that is delayed from the input signal;
   a first set of transistors that includes a first current source transistor, a first cascode transistor, and a first control transistor;
   a second set of transistors that includes a second control transistor, a second cascode transistor, and a second current source transistor; and
   a capacitor that has a node that is electrically connected between the first control transistor and the second control transistor;
   and wherein:
   the first set of transistors form a first current source electrically connected to the capacitor and configured to generate a first current to generate a ramp signal with a first slope under control of the first control transistor; and
   the second set of transistors form a second current source electrically connected to the capacitor and configured to generate a second current to generate the ramp signal with a second slope under control of the second control transistor; and
   the delay circuit transitions a state of the output signal based on a voltage level of the ramp signal.

2. The delay circuit of claim 1, further comprising:
   a plurality of the delay element electrically connected in series.

3. The delay circuit of claim 2, wherein:
   the output signal of a last delay element of the plurality of the delay element has a same state as the input signal of a first delay element of the plurality of the delay element.

4. The delay circuit of claim 1, wherein:
   the first cascode transistor isolates a voltage on the capacitor from the first current source transistor; and
   the second cascode transistor isolates the voltage on the capacitor from the second current source transistor.

5. The delay circuit of claim 1, wherein:
   the second control transistor, the second cascode transistor, and the second current source transistor are deactivated when the second control transistor is deactivated in response to a first state of the input signal; and
   the first current source transistor, the first cascode transistor, and the first control transistor are deactivated when the first control transistor is deactivated in response to a second state of the input signal.

6. The delay circuit of claim 1, wherein:
   the delay element further comprises an output set of transistors that produces the output signal and transitions the state of the output signal when the ramp signal ramps to a threshold voltage at an end of an initial portion of a first time period and when the ramp signal ramps to the threshold voltage at an end of an initial portion of a second time period.

7. The delay circuit of claim 6, further comprising:
   a reference current generator that generates first bias control signals and second bias control signals, the first bias control signals and the second bias control signals being based on a reference current that is generated in the reference current generator and that is dependent on a supply voltage and a resistance of a resistor;
   wherein:
   the first current source generates the first current about equal to the reference current in accordance with the first bias control signals during the first time period; and
   the second current source generates the second current about equal to the reference current in accordance with the second bias control signals during the second time period.

8. The delay circuit of claim 7, further comprising:
   a delay stage having a first one of the delay element and a second one of the delay element electrically connected in series;
   and wherein:
   the output signal of the second one of the delay element is delayed from the input signal of the first one of the delay element by a stage delay time period;
   the stage delay time period is determined substantially by the resistance of the resistor and a capacitance of the capacitor; and
   the stage delay time period is substantially independent of the supply voltage and a temperature of the delay circuit.

9. The delay circuit of claim 1, wherein:
the delay element further comprises:
- a first bias transistor that causes the ramp signal to be biased to a first voltage when the first set of transistors is activated at a start of a first time period, which causes the ramp signal to ramp during the first time period from the first voltage towards a second voltage, and which causes the ramp signal to be substantially linear during an initial portion of the first time period; and
- a second bias transistor that causes the ramp signal to be biased to the second voltage when the second set of transistors is activated at a start of a second time period, which causes the ramp signal to ramp during the second time period from the second voltage towards the first voltage, and which causes the ramp signal to be substantially linear during an initial portion of the second time period.

10. The delay circuit of claim 1, wherein:
the delay element further comprises an input set of transistors that inverts the input signal to produce an inverted input signal;
the first set of transistors is activated by a first state of the inverted input signal and is deactivated by a second state of the inverted input signal; and
the second set of transistors is activated by the second state of the inverted input signal and is deactivated by the first state of the inverted input signal.

11. A delay circuit comprising:
a delay element that comprises:
- an input configured to receive an input signal;
- an output configured to produce an output signal that is delayed from the input signal;
- a capacitor;
- a first set of transistors that forms a first current source configured to generate a first current to generate a ramp signal with a first slope under control of the first set of transistors;
- a second set of transistors that forms a second current source configured to generate a second current to generate the ramp signal with a second slope under control of the second set of transistors, and wherein the capacitor has a node that is electrically connected between the first set of transistors and the second set of transistors;
- a first bias transistor configured to cause the ramp signal to be biased to a first voltage when the first set of transistors is activated at a start of a first time period, which causes the ramp signal to ramp during the first time period from the first voltage towards a second voltage, and which causes the ramp signal to be substantially linear during an initial portion of the first time period; and
- a second bias transistor configured to cause the ramp signal to be biased to the second voltage when the second set of transistors is activated at a start of a second time period, which causes the ramp signal to ramp during the second time period from the second voltage towards the first voltage, and which causes the ramp signal to be substantially linear during an initial portion of the second time period;
and wherein:
the delay circuit transitions a state of the output signal based on a voltage level of the ramp signal.

12. The delay circuit of claim 11, further comprising:
a plurality of the delay element electrically connected in series.

13. The delay circuit of claim 12, wherein:
the output signal of a last delay element of the plurality of the delay element has a same state as the input signal of a first delay element of the plurality of the delay element.

14. The delay circuit of claim 11, wherein:
the first set of transistors includes a first current source transistor and a first cascode transistor;
the second set of transistors includes a second cascode transistor and a second current source transistor;
the first cascode transistor isolates a voltage on the capacitor from the first current source transistor; and
the second cascode transistor isolates the voltage on the capacitor from the second current source transistor.

15. The delay circuit of claim 11, wherein:
the second set of transistors is deactivated in response to a first state of the input signal; and
the first set of transistors is deactivated in response to a second state of the input signal.

16. The delay circuit of claim 11, wherein:
the delay element further comprises an output set of transistors that produces the output signal and transitions the state of the output signal when the ramp signal ramps to a threshold voltage at an end of the initial portion of the first time period and when the ramp signal ramps to the threshold voltage at an end of the initial portion of the second time period.

17. The delay circuit of claim 16, further comprising:
a reference current generator that generates first bias control signals and second bias control signals, the first bias control signals and the second bias control signals being based on a reference current that is generated in the reference current generator and that is dependent on the second voltage and a resistance of a resistor;
wherein:
the first current source generates the first current about equal to the reference current in accordance with the first bias control signals during the first time period; and
the second current source generates the second current about equal to the reference current in accordance with the second bias control signals during the second time period.

18. The delay circuit of claim 17, further comprising:
a delay stage having a first one of the delay element and a second one of the delay element electrically connected in series;
and wherein:
the output signal of the second one of the delay element is delayed from the input signal of the first one of the delay element by a stage delay time period;
the stage delay time period is determined substantially by the resistance of the resistor and a capacitance of the capacitor; and
the stage delay time period is substantially independent of a supply voltage and a temperature of the delay circuit.

19. The delay circuit of claim 11, wherein:
the delay element further comprises an input set of transistors that inverts the input signal to produce an inverted input signal;
the first set of transistors is activated by a first state of the inverted input signal and is deactivated by a second state of the inverted input signal; and
the second set of transistors is activated by the second state of the inverted input signal and is deactivated by the first state of the inverted input signal.

20. A delay circuit comprising;
a reference current generator configured to generate first bias control signals and second bias control signals, the first bias control signals and the second bias control signals being based on a reference current that is generated in the reference current generator and that is dependent on a first voltage and a resistance of a resistor; and
a delay stage having a first delay element and a second delay element electrically connected in series;
and wherein:
the first delay element and the second delay element each comprise:
  a capacitor having a capacitance;
  a first set of transistors configured to form a first current source when activated, the first current source generating a first current about equal to the reference current and being electrically connected to the capacitor to generate a ramp signal with a first slope during a first time period;
  a second set of transistors configured to form a second current source when activated, the second current source generating a second current about equal to the reference current and being electrically connected to the capacitor to generate the ramp signal with a second slope during a second time period;
  a first bias transistor configured to cause the ramp signal to be biased to a second voltage when the first set of transistors is activated at a start of the first time period, which causes the ramp signal to ramp during the first time period from the second voltage towards the first voltage, and which causes the ramp signal to be substantially linear during an initial portion of the first time period;
  a second bias transistor configured to cause the ramp signal to be biased to the first voltage when the second set of transistors is activated at a start of the second time period, which causes the ramp signal to ramp during the second time period from the first voltage towards the second voltage, and which causes the ramp signal to be substantially linear during an initial portion of the second time period; and
  an output set of transistors configured to produce an output signal when the ramp signal ramps to a threshold voltage at an end of the initial portion of the first time period and when the ramp signal ramps to the threshold voltage at an end of the initial portion of the second time period;
the output signal of the first delay element is provided as an input signal for the second delay element;
the output signal of the second delay element is delayed from an input signal of the first delay element by a stage delay time period;
the stage delay time period is determined substantially by the resistance of the resistor and the capacitance of the capacitor; and
the stage delay time period is substantially independent of the first voltage and a temperature of the delay circuit.

\* \* \* \* \*